United States Patent
Park et al.

(10) Patent No.: US 7,247,878 B2
(45) Date of Patent: Jul. 24, 2007

(54) DUAL PANEL-TYPE ORGANIC ELECTROLUMINESCENT DEVICE

(75) Inventors: Jae-Yong Park, Gyeonggi-do (KR); So-Haeong Cho, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 3 days.

(21) Appl. No.: 10/744,108

(22) Filed: Dec. 24, 2003

(65) Prior Publication Data

US 2004/0195959 A1   Oct. 7, 2004

(30) Foreign Application Priority Data

Dec. 28, 2002   (KR) .................. 10-2002-0086106

(51) Int. Cl.
- *H01L 35/24* (2006.01)
- *H01L 29/04* (2006.01)
- *H01L 31/036* (2006.01)
- *H01L 23/58* (2006.01)

(52) U.S. Cl. .................. 257/40; 257/59; 257/72; 257/642

(58) Field of Classification Search ............ 257/72, 257/55, 288, 297, 642, 59, 643
See application file for complete search history.

(56) References Cited

U.S. PATENT DOCUMENTS

| | | | |
|---|---|---|---|
| 6,175,345 B1 * | 1/2001 | Kuribayashi et al. | 345/76 |
| 6,548,961 B2 | 4/2003 | Barth et al. | |
| 6,617,608 B2 * | 9/2003 | Bae et al. | 257/40 |
| 6,984,847 B2 * | 1/2006 | Park et al. | 257/40 |
| 2002/0079494 A1 | 6/2002 | Kim et al. | |
| 2002/0158577 A1 | 10/2002 | Shimoda et al. | |
| 2002/0195961 A1 | 12/2002 | Barth et al. | |
| 2003/0201445 A1 | 10/2003 | Park et al. | |
| 2003/0205763 A1 | 11/2003 | Park et al. | |
| 2004/0135520 A1 | 7/2004 | Park et al. | |

FOREIGN PATENT DOCUMENTS

| | | |
|---|---|---|
| DE | 103 61 010 | 8/2004 |
| EP | 0 884 930 | 12/1998 |
| EP | 1 178 709 | 2/2002 |

(Continued)

*Primary Examiner*—Chuong Anh Luu
(74) *Attorney, Agent, or Firm*—Morgan, Lewis & Bockius, LLP

(57) ABSTRACT

A dual panel-type active matrix organic electroluminescent device includes a gate line disposed along a first direction on a first substrate, a data line disposed along a second direction on the first substrate, a power line disposed along the second direction on the first substrate and spaced apart from the data line to define a pixel region with the gate and data lines, the power line and the gate line both formed of a same material during a same process, a switching thin film transistor disposed on the first substrate near a crossing of the gate and data lines, a driving thin film transistor disposed on the first substrate near a crossing of the gate and power lines, a connecting pattern within the pixel region on the first substrate formed of an insulating material, and a connecting electrode disposed within the pixel region on the first substrate to cover the connecting pattern and electrically interconnecting the driving thin film transistor to an organic electroluminescent diode.

16 Claims, 40 Drawing Sheets

FOREIGN PATENT DOCUMENTS

| | | |
|---|---|---|
| FR | 2849959 | 7/2004 |
| JP | 2001-177509 | 4/2001 |
| KR | 2002-0047889 | 6/2002 |
| KR | 1020020058269 | 7/2002 |
| KR | 2004-0079476 | 9/2004 |
| WO | WO-02/078101 | 10/2002 |

\* cited by examiner

XVI — XVI

XVI — XVI

DUAL PANEL-TYPE ORGANIC ELECTROLUMINESCENT DEVICE

The present invention claims the benefit of Korean Patent Application No. 2002-0086106 filed in Korea on Dec. 28, 2002, which is hereby incorporated by reference.

BACKGROUND OF THE INVENTION

1. Field of the Invention

The present invention relates to an organic electroluminescent display device, and more particularly, to an active matrix electroluminescent display device.

2. Discussion of the Related Art

As information technology increases, a necessity for flat panel displays having thin profiles, lightweight, and lower power consumption has increased. Accordingly, various flat panel display (FPD) devices, such as liquid crystal display (LCD) devices, plasma display panel (PDP) devices, field emission display devices, and electro-luminescence display (ELD) devices, have been developed.

The ELD devices make use of an electro-luminescence phenomenon in which light is generated when an electric field of certain intensity is supplied to a fluorescent substance. The ELD devices can be classified into inorganic electroluminescence display (IELD) devices and organic electroluminescent display (OELD) devices, depending upon a source that excites carriers. The OELD devices have been increasingly used due to their ability to display a wide range of wavelengths of visible light, and because of their high brightness and low voltage requirements.

In addition, since the OELD devices are a self-luminescent, they have a high contrast ratio and are suitable for ultra-thin type display devices. Since they have simple manufacturing processes, the degree of environmental contamination is relatively low. Furthermore, the OELD devices have response times of only a few microseconds (μs), thereby making the OELD devices suitable for displaying moving images. Moreover, the OELD devices have no limit for viewing angles and are stable at low temperature conditions. In addition, since the OELD devices are driven with a relatively low voltage between 5V and 15V, manufacturing and design of their driving circuits are easy.

Structures of the OELD devices are similar to that of the IELD devices, but the light-emitting theory of the OELD devices is different from that of the IELD devices. For example, the OELD devices emit light by recombination of electrons and holes, and thus they are commonly referred to as organic light emitting diode (OLED) devices.

Recently, active matrix types of IELD devices having a plurality of pixels arranged in a matrix configuration and a thin film transistor connected thereto have been commonly applied to the flat panel display devices. The active matrix type has also been applied to the OELD devices, and this is commonly referred to as an active matrix OELD device.

FIG. 1 is an equivalent circuit diagram of a basic pixel structure of an active matrix OELD device according to the related art. In FIG. 1, a pixel of the active matrix OELD device has a switching thin film transistor $T_S$, a driving thin film transistor $T_D$, a storage capacitor $C_{ST}$, and a light emitting diode (LED) E. The switching thin film transistor $T_S$ and the driving thin film transistor $T_D$ are comprised of p-type polycrystalline silicon thin film transistors. A gate electrode of the switching thin film transistor $T_S$ is connected to the gate line GL, and a source electrode of the switching thin film transistor $T_S$ is connected to the data line DL. A drain electrode of the switching thin film transistor $T_S$ is connected to a gate electrode of the driving thin film transistor $T_D$, and a drain electrode of the driving thin film transistor $T_D$ is connected to an anode electrode of the light emitting diode (LED) E. A cathode electrode of the light emitting diode (LED) E is grounded, a source electrode of the driving thin film transistor $T_D$ is connected to a power line PL, and a storage capacitor $C_{ST}$ is connected to both the gate electrode of the switching thin film transistor $T_S$ and the source electrode of the driving thin film transistor $T_D$.

In the pixel structure of FIG. 1, if a scanning signal is supplied to the gate line GL, then the switching thin film transistor $T_S$ is turned ON and an image signal from the data line DL is stored into the storage capacitor $C_{ST}$ through the switching thin film transistor $T_S$. If the image signal is supplied to the gate electrode of the driving thin film transistor $T_D$, then the driving thin film transistor $T_D$ is turned ON and the light emitting diode (LED) E emits light. Luminance of the light emitting diode (LED) E is controlled by varying an electric current of the light emitting diode (LED) E, and the storage capacitor $C_{ST}$ serves to keep a gate voltage of the driving thin film transistor $T_D$ constant while the switching thin film transistor $T_S$ is turned OFF. For example, since the driving thin film transistor $T_D$ can be driven by a stored voltage in the storage capacitor $C_{ST}$ even when the switch thin film transistor $T_S$ is turned OFF, the electric current can keep flowing into the light emitting diode (LED) E, and thus the light emitting diode (LED) E emits light until a next image signal is received.

FIG. 2 is a plan view of a basic pixel structure of an active matrix OELD device according the related art. In FIG. 2, a gate line 37 is disposed along a first direction, and a data line 51 and a power line 41 are disposed along a second direction perpendicularly crossing the gate line 37, whereby the power line 41 and the data line 51 define a pixel region P by the crossing of the gate line 37 and a switching thin film transistor $T_S$ is disposed near a crossing of the gate and data lines 37 and 51. In addition, a driving thin film transistor $T_D$ is located near a crossing of the gate and power lines 37 and 51 next to the switching thin film transistor $T_S$, and a first electrode 58 of a light emitting diode is connected to the driving thin film transistor $T_D$. A storage capacitor $C_{ST}$ is disposed over the power line 41 and is comprised of a capacitor electrode 34 to function as a first storage electrode and a portion of the power line PL to function as a second storage electrode. Although not shown in FIG. 2, an organic electroluminescent layer and a second electrode are disposed in series on the first electrode 58. Thus, the area where the first electrode 58 is disposed can be referred to as an organic electroluminescent area.

In FIG. 2, the switching thin film transistor $T_S$ includes a first gate electrode 35 that extends from the gate line 37, and a first semiconductor layer 31 that is formed with the capacitor electrode 34. The driving thin film transistor $T_D$ includes a second gate electrode 38 and a second semiconductor layer 32, wherein the second semiconductor layer 32 is also formed with the capacitor electrode 34 and the first semiconductor layer 31.

FIG. 3 is a cross sectional view along III—III of FIG. 2 showing a driving thin film transistor, a storage capacitor, and a light emitting diode according to the related art. In FIG. 3, a buffer layer 30 is formed along an entire surface of a substrate 1, both a driving thin film transistor $T_D$ and a storage capacitor $C_{ST}$ are disposed on the buffer layer 30, and a light emitting diode E is formed over the substrate 1. The driving thin film transistor $T_D$ includes a semiconductor layer 32, a gate electrode 38, a source electrode 50, and a drain electrode 52. The storage capacitor $C_{ST}$ includes a capacitor electrode 34 and a power line 41 with an interposed insulator 40, wherein the capacitor electrode 34 is formed of the same material as the semiconductor layer 32 during a same process step. The source electrode 50 of the driving thin film transistor $T_D$ is connected to the power line 41, and the drain electrode 52 of the thin film transistor $T_D$ is connected to a first electrode 58 of the light emitting diode E.

In addition, an organic electroluminescent layer 64 and a second electrode 66 are sequentially disposed on the first electrode 58, wherein the first electrode 58 functions as an anode and the second electrode 66 function as a cathode and both include an opaque metallic material. The first electrode 58, the organic electroluminescent layer 64, and the second electrode 66 constitute a light emitting diode E.

In the OELD device of FIG. 3, there are a plurality of insulators disposed between the conductive layer elements. For example, the buffer layer 30, i.e., a first insulator, is interposed between the substrate 1 and the semiconductor layer 32, and a gate insulator 36, i.e., a second insulator, is interposed between the semiconductor layer and the gate electrode 38. Furthermore, a third insulator 40 is interposed between the capacitor electrode 34 and the power line 41, a fourth insulator 44 is interposed between the power line 41 and the source electrode 50, a fifth insulator 54 is interposed between the drain electrode 52 and the first electrode 58 of the light emitting diode E, and a sixth insulator 60 is interposed between the first electrode 58 and the second electrode 66. Additionally, the third and sixth insulators 40, 44, 54, and 60 have contact holes through which the conductive layer elements electrically communicate with each other.

FIGS. 4A to 4I are cross sectional views showing a fabricating process of the active matrix OELD device of FIG. 3 according to the related art. Many of the patterns shown in FIGS. 4A to 4I are formed through photolithographic processes including photoresist (PR) coating, aligning, exposing, and developing steps using a mask.

In FIG. 4A, after a buffer layer 30 is formed along an entire surface of a substrate 1, first and second semiconductor layers 32 and 34 of polycrystalline silicon are formed on the buffer layer 30 using a first mask process. The first and second polycrystalline semiconductor layers 32 and 34 have island shapes.

In FIG. 4B, an insulator of silicon nitride or silicon oxide and a conductive material of metal are sequentially deposited on the first polycrystalline silicon layer 32, and then patterned using a second mask, thereby sequentially forming a gate insulation layer 36 and a gate electrode 38 on the first polycrystalline semiconductor layer 32. Thereafter, impurities, such as p-type ions or n-type ions, are doped on exposed portions of the first and second polycrystalline semiconductor layers 32 and 34. During the doping process, the gate electrode 38 functions as a mask so that the first polycrystalline semiconductor layer 32 is divided into an active region 32a where the impurities are not doped and drain and source regions 32b and 32c where the impurities are doped. Furthermore, the second polycrystalline semiconductor layer 34 upon which the impurities are fully doped becomes a capacitor electrode, and the drain and source regions 32b and 32c are located on both sides of the active region 32a.

In FIG. 4C, a first interlayer insulator 40 is formed along an entire surface of the buffer layer 30 to cover the gate electrode 38, the drain and source regions 32b and 32c, and the capacitor electrode 34. Next, a power line 41 of metal is formed using a third mask process on the first interlayer insulator 40 to overlap the capacitor electrode 34. Since the power line 41 is formed directly above the capacitor electrode 34, it forms a storage capacitor with the capacitor electrode 34 and the interposed first interlayer insulator 40.

In FIG. 4D, a second interlayer insulator 44 is formed on the first interlayer insulator 40 and the power line 41. Then, first, second, and third contact holes 46a, 46b, and 46c are formed using a fourth mask process, wherein the first contact hole 46a exposes the drain region 32b, the second contact hole 46b exposes the source region 32c, and the third contact hole 46c exposes the power line 41.

In FIG. 4E, a metal layer is formed on the second interlayer insulator layer 44 and patterned using a fifth mask process, thereby forming a source electrode 50 and a drain electrode 52. The drain electrode 52 contacts the drain region 32b through the first contact hole 46a, and the source electrode 50 contacts the source region 32c through the second contact hole 46b. Furthermore, the source electrode 50 contacts the power line 41 through the third contact hole 46c.

Accordingly, formation of a driving thin film transistor $T_D$ having the semiconductor layer 32, the gate electrode 38, the drain electrode 52 and the source electrode 50 is completed. Moreover, a region corresponding to the power line 41 and the capacitor electrode 34 forms the storage capacitor $C_{ST}$. Although not shown in FIG. 4E, but shown in FIG. 3, the gate electrode 38 of the driving thin film transistor $T_D$ is connected to the switching thin film transistor $T_S$, and the power line 41 is disposed parallel to the data line 51.

In FIG. 4F, a first passivation layer 54 having a fourth contact hole 56 resulting from a sixth mask process is formed on the second interlayer insulator 44 while covering the source and drain electrodes 50 and 52. The fourth contact hole 56 exposes a portion of the drain electrode 52.

In FIG. 4G, a transparent conductive material is deposited on the first passivation layer 54. Then, the transparent conductive material is patterned using a seventh mask process, thereby forming a first electrode 58 that contacts the drain electrode 52 through the fourth contact hole 56.

In FIG. 4H, a second passivation layer 60 is formed on the first electrode 58 and the exposed portion of the first passivation layer 54. Then, the second passivation layer 60 is patterned using an eighth mask process, thereby forming an opening 62 that exposes a portion of the first electrode 58. The second passivation layer 60 protects the driving thin film transistor TD from moisture and particles that may exist in the air.

In FIG. 4I, an organic electroluminescent layer 64 is formed on the second passivation layer 60 to contact the first electrode 58 through the opening 62. Then, a second electrode 66 is formed on the organic electroluminescent layer 64 and the exposed portion of the second passivation layer 60 to entirely cover the substrate 1.

The second electrode 66 is formed of an opaque metallic material and acts as cathode, while the first electrode 58 is formed of a transparent conductive material and acts as anode. Moreover, the material for the second electrode 66 should have a small work function in order to easily release the electrons. Therefore, the OELD device of FIG. 4F is a considered a bottom emission-type OELD device that emits light a bottom direction toward the substrate 1.

FIG. 5 is a cross sectional view of an OELD device according to the related art. In FIG. 5, first and second spaced apart substrates 70 and 90, which have inner surfaces facing each other, have a plurality of sub-pixel regions. Then, an array layer 80, which includes a driving thin film transistor (TFT) $T_D$ within each sub-pixel region, is formed along an inner surface of the first substrate 70, and a first electrode 72 connected to the driving TFT $T_D$ is formed on the array layer 80 within each pixel region. Next, red, green, and blue organic electroluminescent (EL) layers 74 are alternately formed on the first electrode 72, and a second electrode 76 is formed on the organic EL layers 74. Accordingly, the first and second electrodes 72 and 76 and the organic EL layer 74 interposed therebetween constitute an organic EL diode E. The organic EL device shown in FIG. 5 is a bottom-type OELD where light is emitted from the organic EL layer 74 through the first electrode 72 and out of the first substrate 70.

In FIG. 5, the second substrate 90 is used as an encapsulation substrate and includes a concave portion 92 at an inner center portion of the second substrate 90, wherein the concave portion 92 is filled with a moisture absorbent desiccant 94 that removes moisture and oxygen to protect the organic EL diode E. In addition, the inner surface of the second substrate 90 is spaced apart from the second electrode 76, wherein the first and second substrates 70 and 90 are attached with a sealant 85 at a peripheral portion of the first and second substrates 70 and 90 for encapsulation.

In OLED devices according to the related art, a TFT array part and an organic electroluminescent (EL) diode are formed over the same substrate (i.e., a first substrate), and an additional second substrate is attached to the first substrate for encapsulation. However, when the TFT array part and the organic EL diode are formed on one substrate in this way, production yield of the OELD device is determined by a multiplication of the TFT's yield together with the organic EL diode's yield. Since the organic EL diode's yield is relatively low, the production yield of the overall OLED device becomes limited by the organic EL diode's yield. For example, even when a TFT is properly fabricated, the OLED device using a thin film of about 1000 angstroms (Å) thickness can be judged to be inferior due to the defects of an organic electroluminescent layer. This results in loss of materials and increased production costs.

In general, the OLED devices are classified into bottom emission-types and top emission-types according to an emission direction of light used for displaying images via the OELDs. Bottom emission-type OLED devices have the advantage of high encapsulation stability and high process flexibility. However, the bottom emission-type OLED devices are ineffective as high resolution devices since the disposition of the thin film transistors and the storage capacitor formed on the substrate results in poor aperture ratios. In contrast to bottom emission-type OLED devices, top emission-type OLED devices have a higher expected life span because they have simpler circuit layouts that yield high aperture ratios. However, in top emission-type OLED devices, the cathode is generally formed on an organic electroluminescent layer. As a result, transmittance and optical efficiency of a top emission-type OLED device are reduced because of a limited number of materials that may be selected as the cathode. If a thin film-type passivation layer is formed on the cathode to prevent the reduction of the light transmittance, the thin film-type passivation layer can still fail in preventing the infiltration of exterior air into the organic electroluminescent layer.

In the above-mentioned processes forming the organic electroluminescent display device, a plurality of thin film depositions is required, and a plurality of photolithographic processes that use multiple masks are also required. Thus, the repeated processing steps increase the mask process. Since the photolithographic processes include a rinsing process, a photoresist deposition process, an exposure process, a developing process, and an etching process, manufacturing time and production costs can be reduced if only a single mask process is omitted. The OELD device described with reference to FIGS. 4A to 4I, however, requires eight masks, resulting in decreased production yield and increased productions costs. Moreover, the more masks the OELD device requires, the more defects the fabrication process creates.

Additionally, since the active matrix OELD device of the related art includes the thin film transistors and the storage capacitors within the light-emitting direction, it has a decreased rumination area and reduced aperture ratios. In order to overcome these problems, current density should be increased to provided for an increase in luminance of the device, thereby causing a decreased life span of the OELD device.

SUMMARY OF THE INVENTION

Accordingly, the present invention is directed to an organic light emitting diode device that substantially obviates one or more of the problems due to limitations and disadvantages of the related art.

An object of the present invention is to provide an organic light emitting diode device having an improved production yield and reduced productions costs.

Another object of the present invention is to provide an organic light emitting diode device having high resolution, high aperture ratios, and long life span.

Another object of the present invention is to provide a dual panel-type organic light emitting diode device in which a TFT array and an organic light emitting diode are disposed in first and second substrates, respectively.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a dual panel-type active matrix organic electroluminescent device includes a gate line disposed along a first direction on a first substrate, a data line disposed along a second direction on the first substrate, a power line disposed along the second direction on the first substrate and spaced apart from the data line to define a pixel region with the gate and data lines, the power line and the gate line both formed of a same material during a same process, a switching thin film transistor disposed on the first substrate near a crossing of the gate and data lines, a driving thin film transistor disposed on the first substrate near a crossing of the gate and power lines, a connecting pattern within the pixel region on the first substrate formed of an insulating material, and a connecting electrode disposed within the pixel region on the first substrate to cover the connecting pattern and electrically interconnecting the driving thin film transistor to an organic electroluminescent diode.

In another aspect, a method of fabricating a dual panel-type active matrix organic electroluminescent device includes patterning a first metal layer to form a gate electrode, a gate line, a power line, a gate pad, and a power pad on a first substrate, forming a first insulating layer on the first substrate to cover the gate electrode, the gate pad, and the power pad, forming a semiconductor layer on the first insulating layer over the gate electrode, the semiconductor layer including an active layer of undoped amorphous silicon and an ohmic contact layer of doped amorphous silicon, forming source and drain electrodes, a data line, a first link electrode, and a data pad, wherein the source and drain electrodes are disposed on the ohmic contact layer, wherein the data line, the data pad, and the first link electrode are disposed on the first insulating layer, and wherein the first link electrode crosses the gate line, forming a channel within the active layer by etching a portion of the ohmic contact exposed between the source and drain electrodes to form a thin film transistor including the gate electrode, the semiconductor layer, the source electrode, and the drain electrode, forming a second insulating layer on the first insulating layer to cover the thin film transistor, the data line, and the data pad, forming a source contact hole, a drain contact hole, a data pad contact hole, a gate pad contact hole, and a power pad contact hole, wherein the source, drain and data pad contact holes penetrate the second insulating layer, and wherein the gate pad and power pad contact holes penetrate the first and second insulating layers, forming a connecting pattern on the pixel region on the second insulating layer using an insulating material, wherein the connecting pattern has a pillar shape and a height greater than a corresponding height of the thin film transistor, and forming a connecting electrode, a power electrode, second link electrodes, a data pad terminal, a gate pad terminal, and a power pad terminal using a third metal layer.

In another aspect, a method of fabricating a dual panel-type active matrix organic electroluminescent device includes patterning a first metal layer to form a gate electrode, a gate line, a power line, a gate pad, and a power pad on a first substrate, forming a first insulating layer, a undoped amorphous silicon layer, a doped amorphous silicon layer, and a second metal layer sequentially on the first substrate to cover the gate electrode, the gate pad, and the power pad, forming a photosensitive photoresist on the second metal layer, disposing a first mask having a half-transmitting portion over the photosensitive photoresist, patterning the undoped amorphous silicon layer, the doped amorphous silicon layer, and the second metal layer simultaneously using a diffraction exposure method using the first mask to form an active layer, an ohmic contact layer, a source electrode, a drain electrode, a data line, a first link electrode, and a data pad, forming a channel in the active layer by etching a portion of the ohmic contact layer exposed between the source and drain electrodes to form a thin film transistor comprising the gate electrode, the active layer, the ohmic contact layer, the source electrode, and the drain electrode, forming a second insulating layer on the first insulating layer to cover the thin film transistor, the data line, and the data pad, forming a source contact hole, a drain contact hole, a data pad contact hole, a gate pad contact hole, and a power pad contact hole, wherein the source, drain, and data pad contact holes penetrate the second insulating layer, and wherein the gate pad and power pad contact holes penetrate the first and second insulating layers, forming a connecting pattern on the pixel region on the second insulating layer using an insulating material, wherein the connecting pattern has a pillar shape and a height higher than a corresponding height of the thin film transistor, and forming a connecting electrode, a power electrode, second link electrodes, a data pad terminal, a gate pad terminal, and a power pad terminal using a third metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
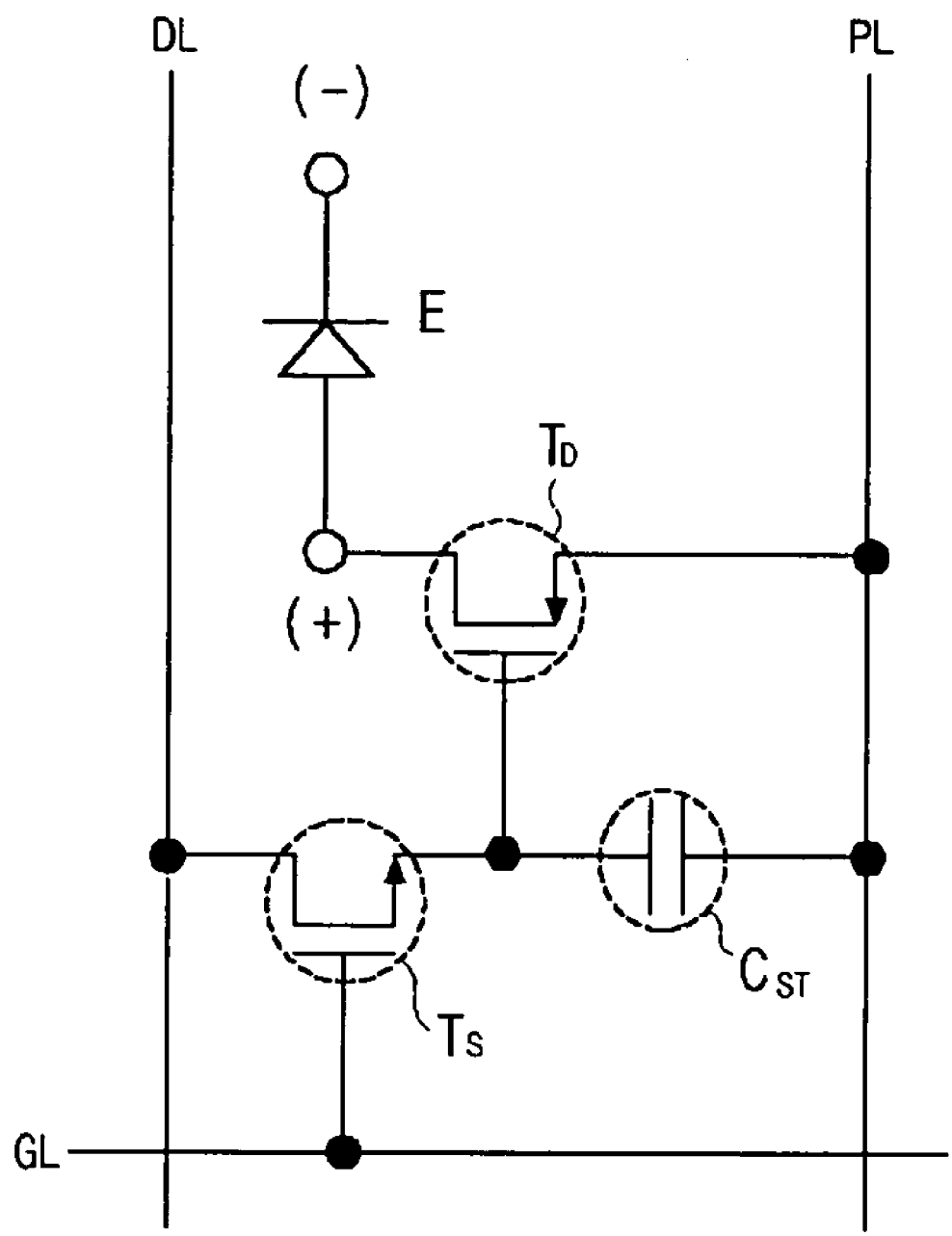
FIG. 1 is an equivalent circuit diagram of a basic pixel structure of an active matrix OELD device according to the related art.
Figure 2:
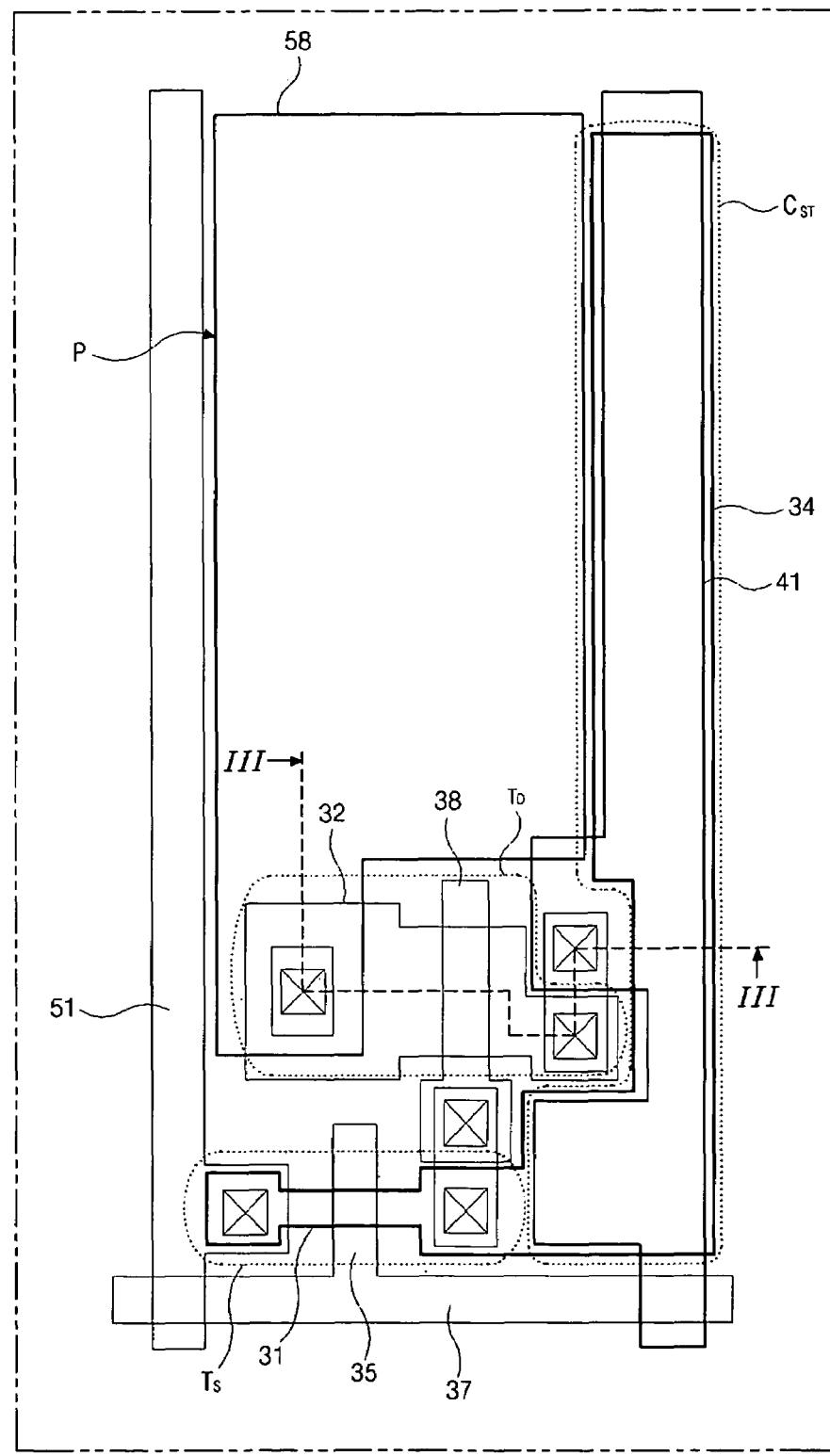
FIG. 2 is a plan view of a basic pixel structure of an active matrix OELD device according the related art.
Figure 3:
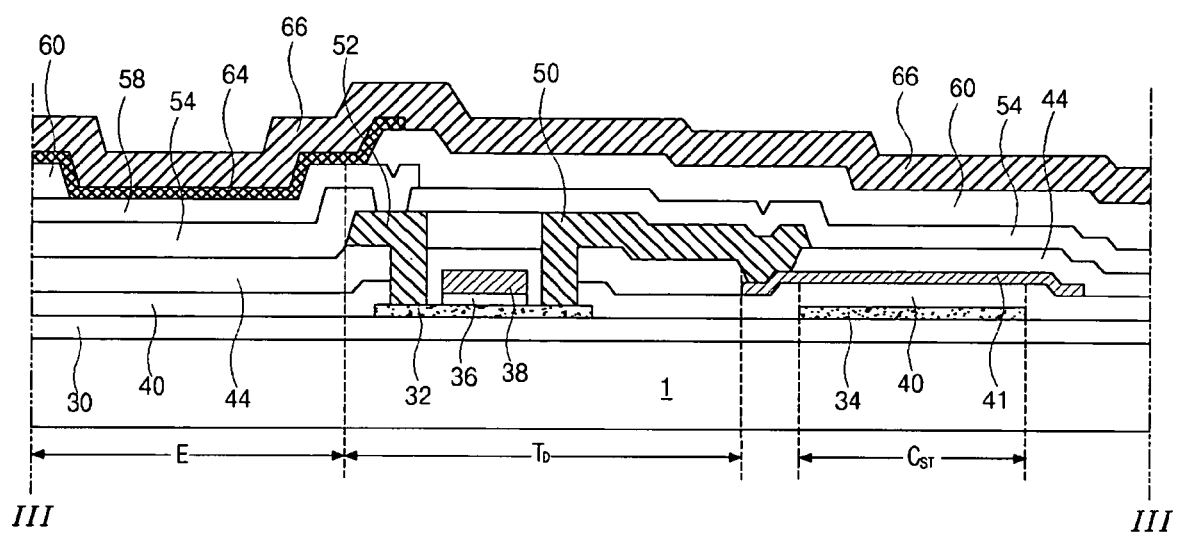
FIG. 3 is a cross sectional view along III—III of FIG. 2 showing a driving thin film transistor, a storage capacitor, and a light emitting diode according to the related art.
Figure 4A:
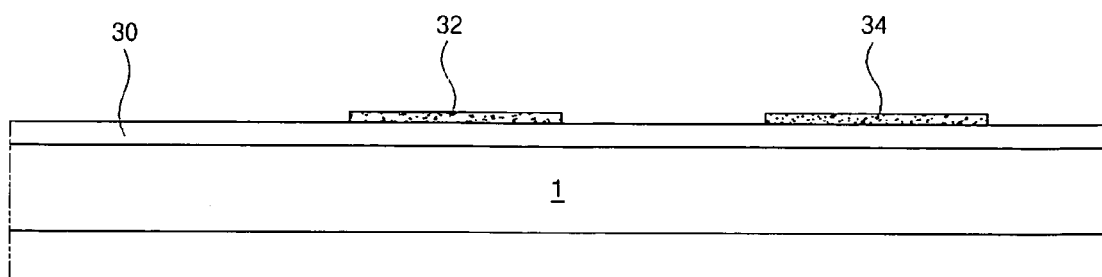
FIGS. 4A to 4I are cross sectional views showing a fabricating process of the active matrix OELD device of FIG. 3 according to the related art.
Figure 4B:
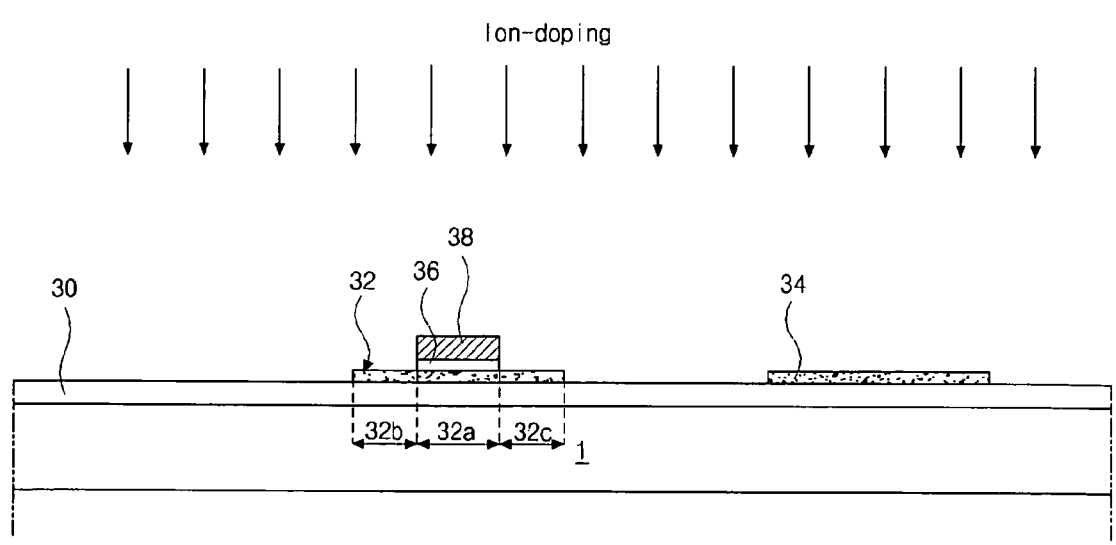
Figure 4C:
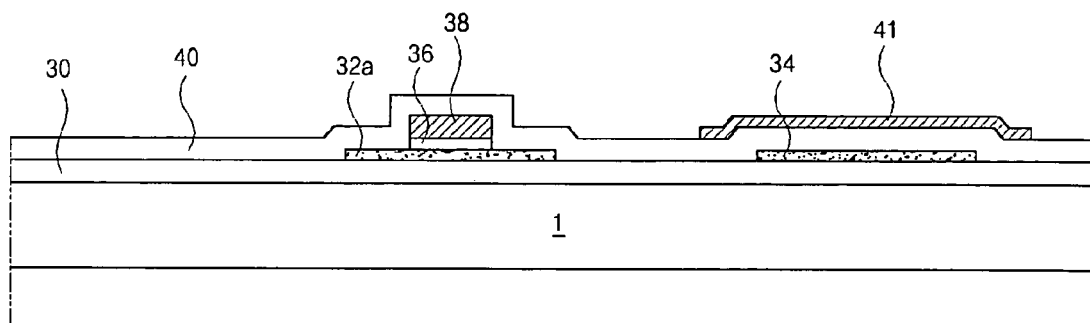
Figure 4D:
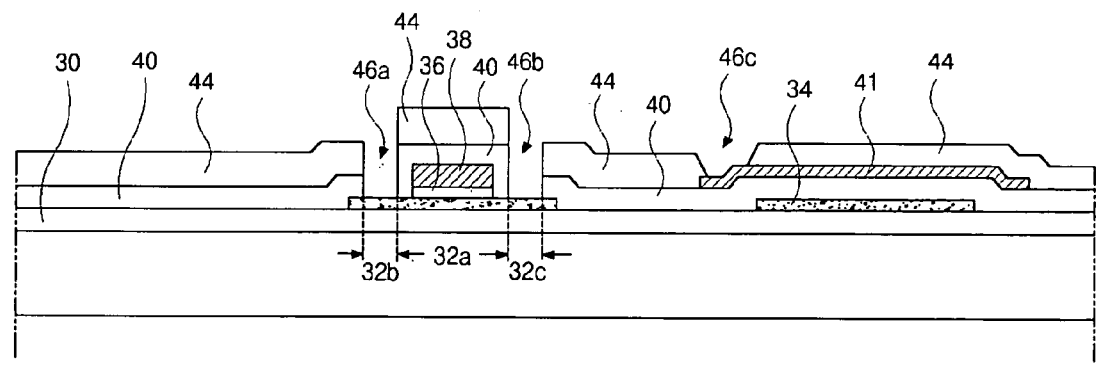
Figure 4E:
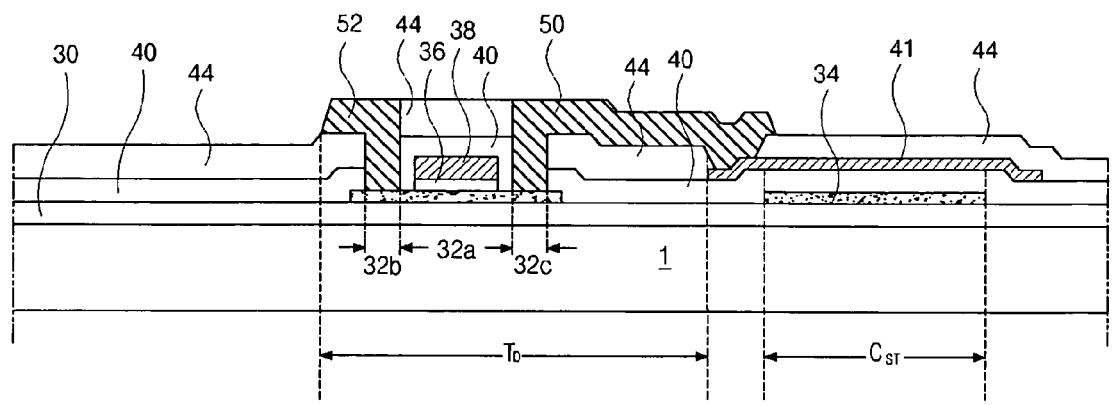
Figure 4F:
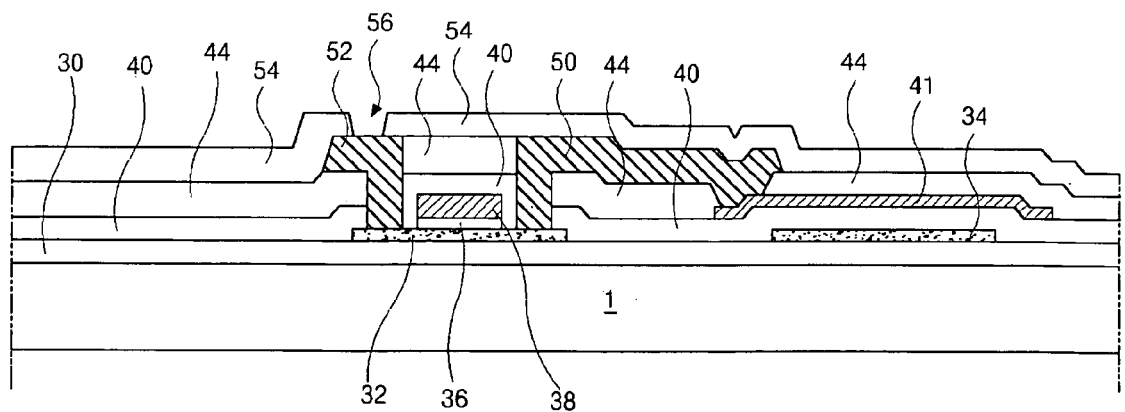
Figure 4G:
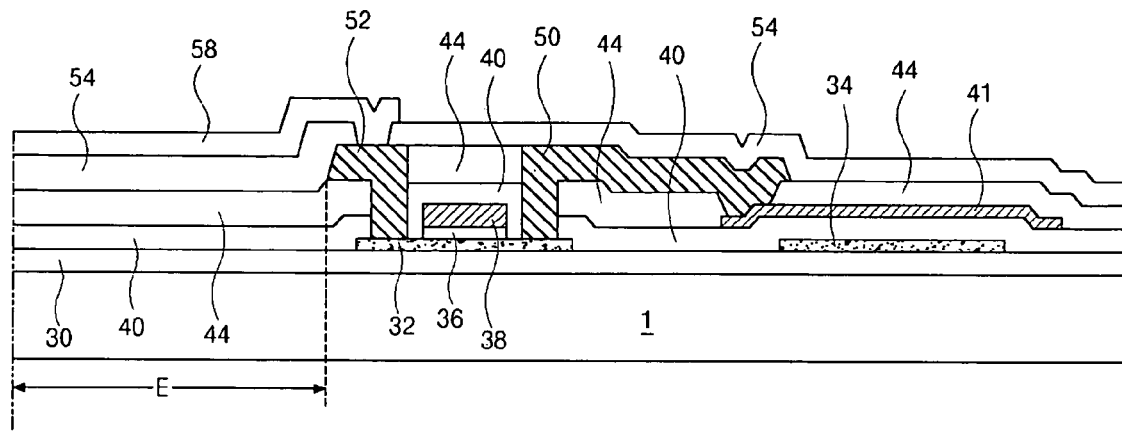
Figure 4H:
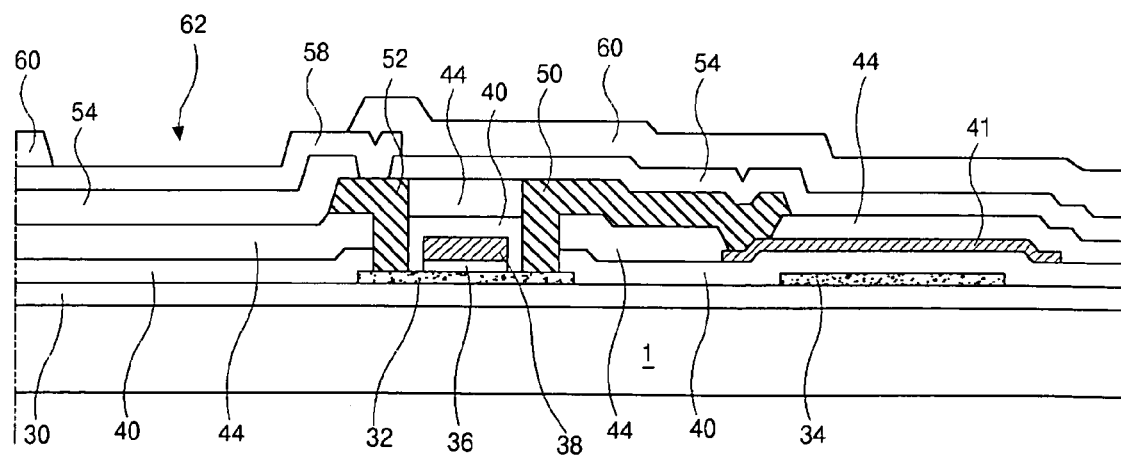
Figure 4I:
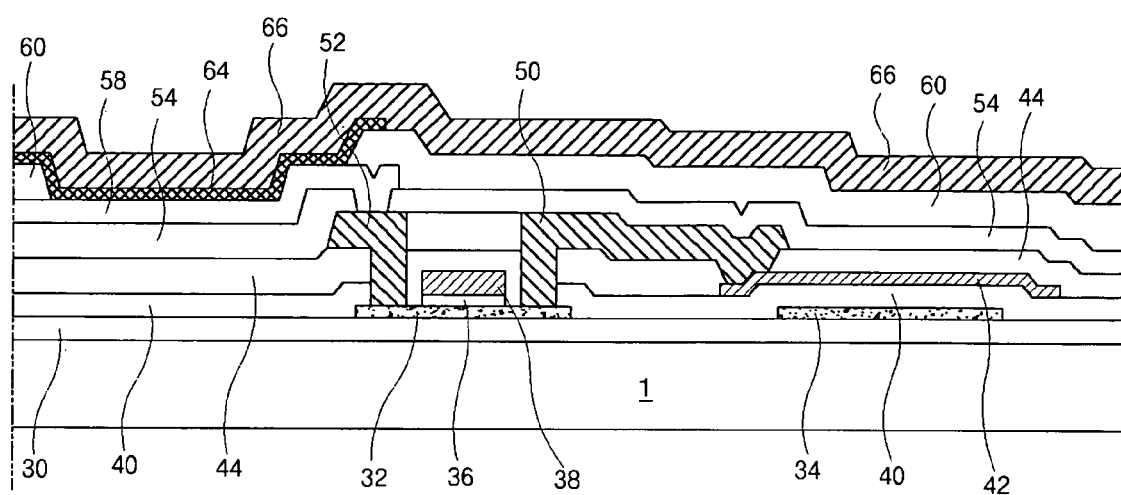
Figure 5:
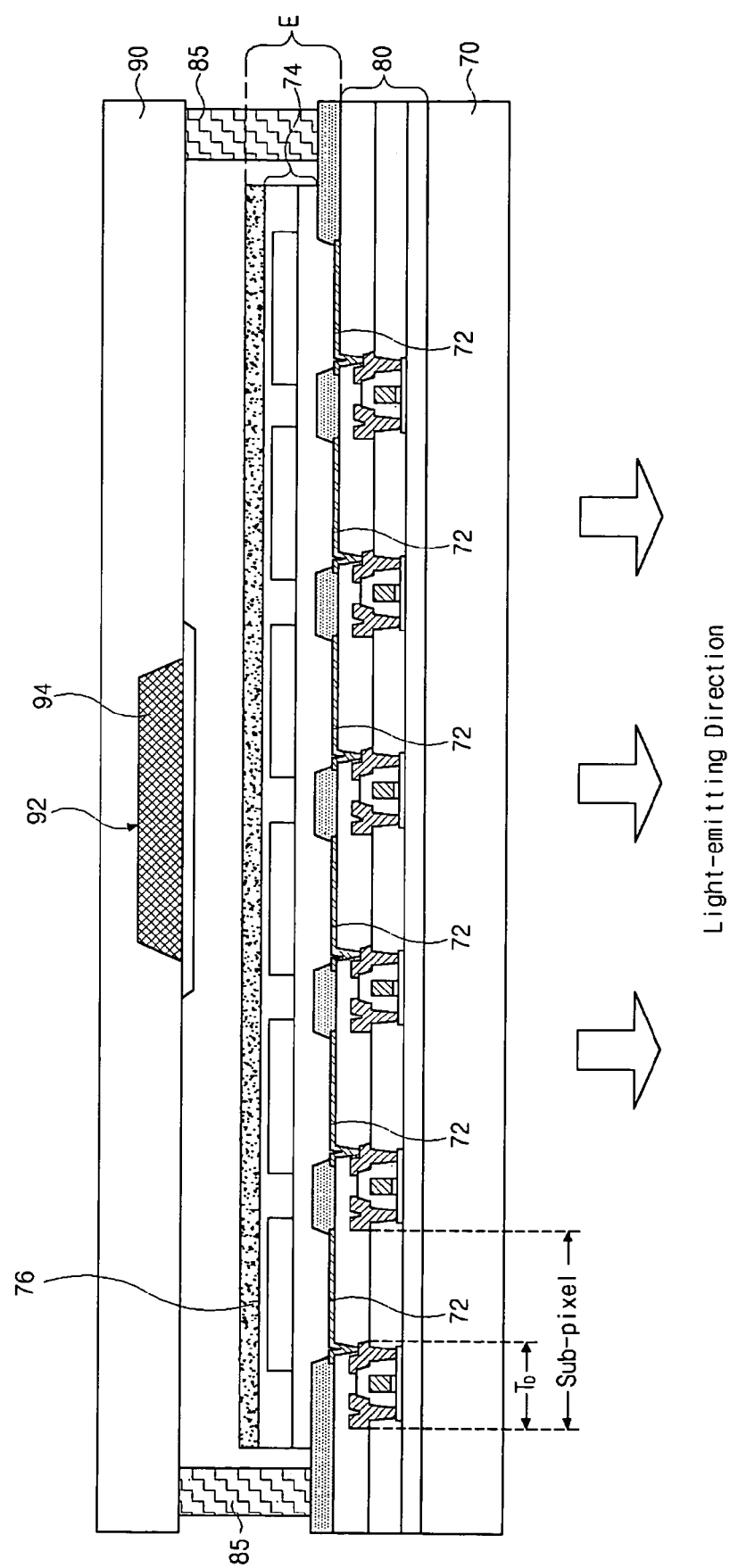
FIG. 5 is a cross sectional view of an OELD device according to the related art.
Figure 6:
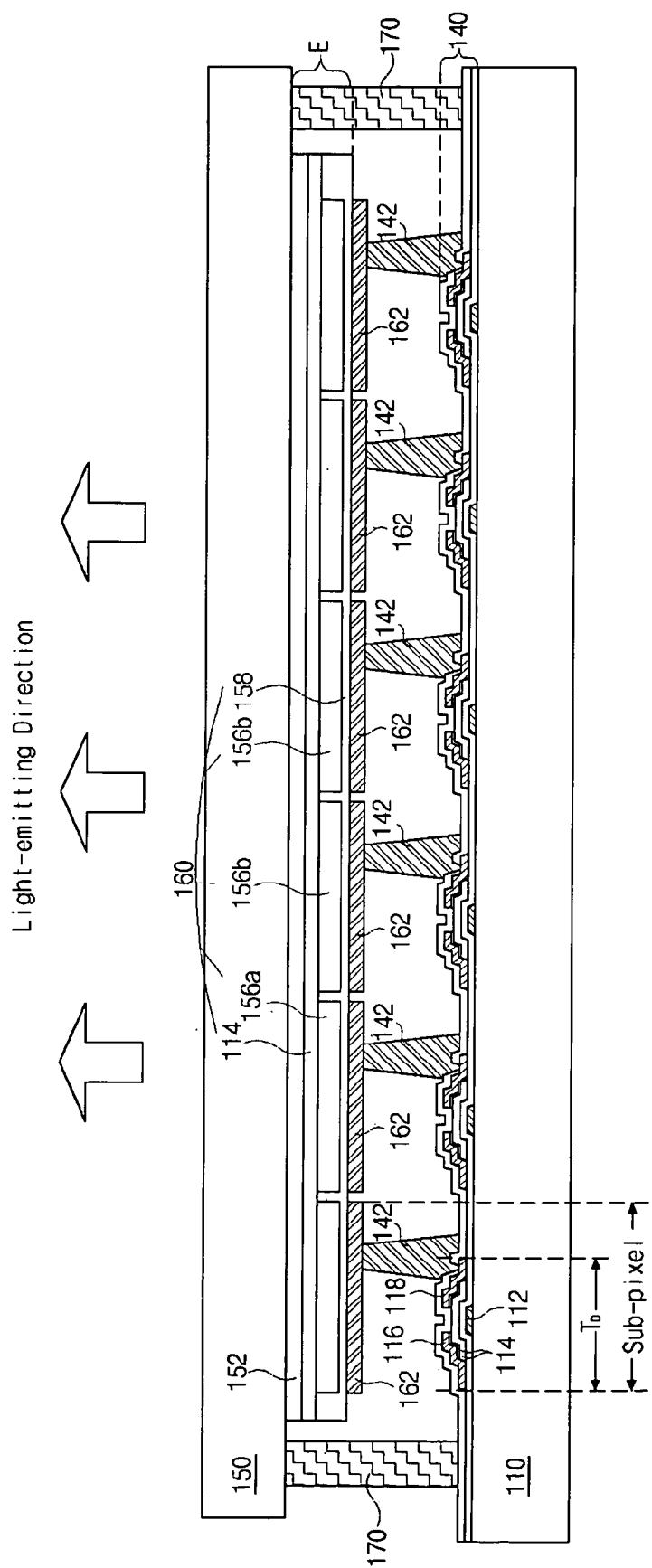
FIG. 6 is a cross sectional view of an exemplary dual panel-type OELD device according to the present invention.

FIG. 6 is a cross sectional view of an exemplary dual panel-type OELD device according to the present invention. In FIG. 6, first and second spaced apart substrates 110 and 150, which may have inner surfaces facing each other, may have a plurality of sub-pixel regions. An array layer 140 including a driving thin film transistor (TFT) $T_D$ within each sub-pixel region may be formed on an inner surface of the first substrate 110, and a connection pattern 142 connected to the driving TFT $T_D$ may be formed on the array layer 140 within each sub-pixel region. The connection pattern 142 may include conductive material or may have a multiple layer structure including an insulating material with one or more layers of conductive material, having sufficient thickness for connection. An additional connection electrode may be used for connecting the connection pattern 142 and the driving TFT $T_D$. The driving TFT $T_D$ may include a gate electrode 112, an active layer 114, and source and drain electrodes 116 and 118, wherein the connection pattern 142 may be connected to the drain electrode 118.

In addition, a first electrode 152 may be formed on an inner surface of the second substrate 150, and an organic electroluminescent (EL) layer 160 including red, green, and blue organic emission layers 156a, 156b, and 156c may be alternately disposed within each sub-pixel region formed on the first electrode 152. A second electrode 162 may be formed on the organic EL layer 160 within each sub-pixel region P, and the organic EL layer 160 may be formed of a single layer structure or of a multiple layer structure. In the case of the multiple layer structure, the organic EL layer 160 may include a first carrier-transporting layer 154 on the first electrode 152, one of red, green, and blue emission layers 156a, 156b, and 156c on the first carrier-transporting layer 154, and a second carrier-transporting layer 158 on each of the red, green, and blue emission layers 156a, 156b, and 156c. For example, when the first and second electrodes 152 and 162 function as an anode and a cathode, respectively, the first carrier-transporting layer 154 may correspond to a hole-injecting layer and a hole-transporting layer, and the second carrier-transporting layer 158 may correspond to an electron-transporting layer and an electron-injecting layer. The first and second electrodes 152 and 162, and the organic EL layer 160 interposed therebetween may constitute an organic EL diode E.

In FIG. 6, the first and second substrates 110 and 150 may be attached together with a sealant 170 along a peripheral portion thereof. Accordingly, a top surface of the connection pattern 142 may contact a bottom surface of the second electrode 162, wherein current of the driving TFT $T_D$ may flow into the second electrode 162 through the connection pattern 142. An organic light emitting diode (OLED) device according to the present invention may include a dual panel-type, wherein an array layer 140 and an organic EL diode E are formed on respective substrates and a connection pattern 142 electrically interconnects the array layer 140 to the organic EL diode E. Since the OLED device according to the present invention is a top emission-type OELD device, a thin film transistor may be easily designed while obtaining high resolution and a high aperture ratio.

Figure 7:
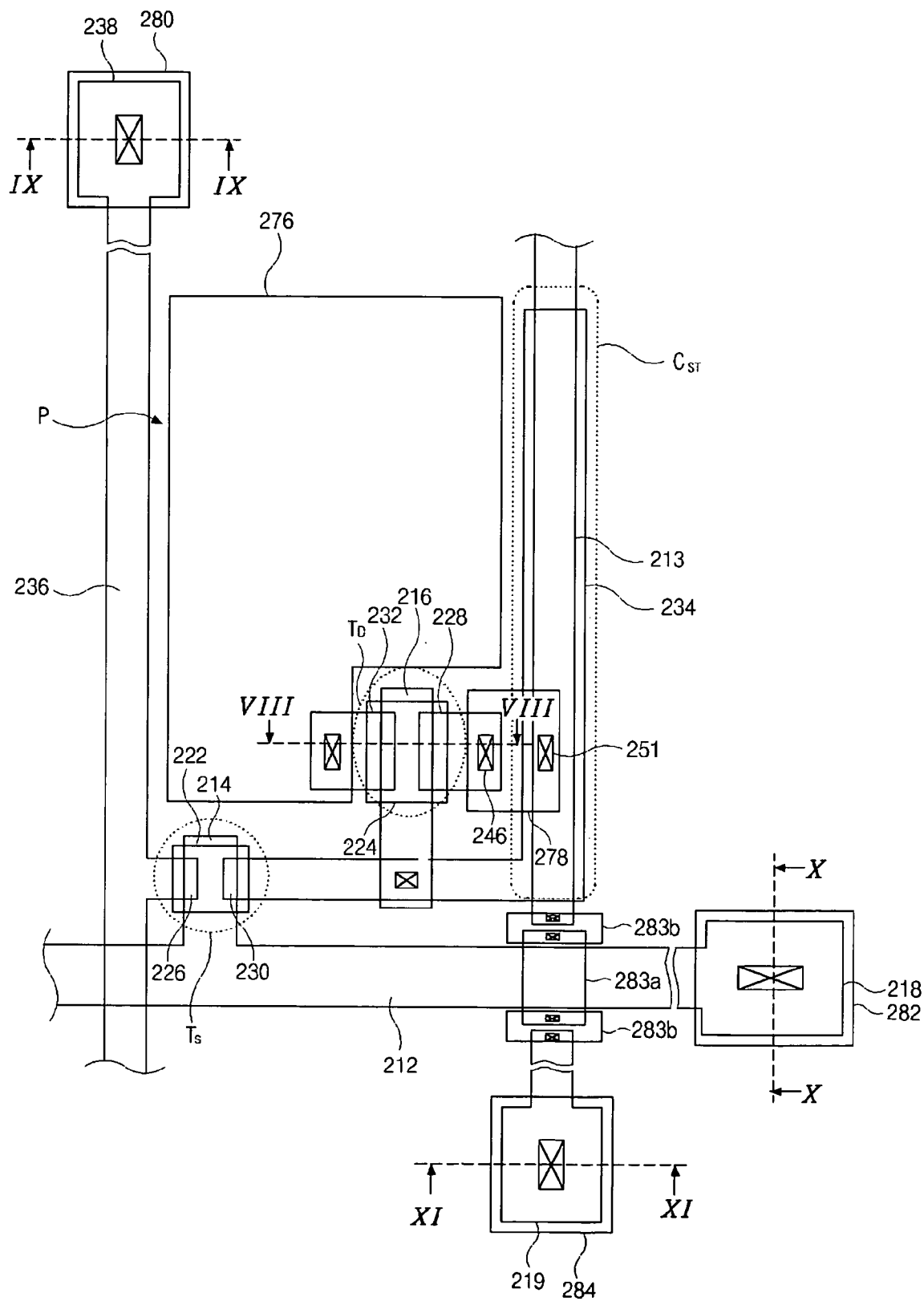
FIG. 7 is a plan view of an exemplary basic pixel structure of a lower panel of a dual panel-type active matrix OELD device according the present invention.

FIG. 7 is a plan view of an exemplary basic pixel structure of a lower panel of a dual panel-type active matrix OELD device according the present invention. In FIG. 7, an active matrix organic light emitting diode (OLED) device may include inverted stagger-type thin film transistors. A gate line 212 may be disposed along a first direction, and a data line 236 and a power line 213, which are spaced apart from each other, may be disposed along a second direction to perpendicularly cross the gate line 212, wherein a pixel region P may be defined between the gate line 212 and the spaced apart data line 236 and power supply line 213. A switching thin film transistor (TFT) $T_S$ may be disposed adjacent to where the gate line 212 and the data line 236 cross each other, and may include a switching gate electrode 214 extending from the gate line 212, a switching source electrode 226 extending from the data line 236, a switching drain electrode 230 spaced apart from the switching source electrode 226, and a switching semiconductor layer 222 having an island shape above the switching gate electrode 214.

The power line 213 and the gate line 212 may be formed during the same processing step. Furthermore, a capacitor electrode 234 perpendicularly extending from the drain electrode 230 may be disposed above the power line 213. Thus, the capacitor electrode 234 constitutes a storage capacitor $C_{ST}$ with a portion of the power line 213 overlapped by the capacitor electrode 234.

A driving TFT $T_D$ may be connected to the switching TFT $T_S$ and the power line 213. The driving TFT $T_D$ may include a driving gate electrode 216, a driving source electrode 228, a driving drain electrode 232, and a driving semiconductor layer 224. The driving gate electrode 216 may be connected with the switching drain electrode 230 and may be formed of the same material as the gate line 212 during the same fabrication step. The driving source and drain electrodes 228 and 232 may overlap side portions of the driving gate electrode 216, and may be formed of the same material as the data line 236. The driving semiconductor layer 224 may have an island shape and may be disposed above the driving gate electrode 216 between the driving source and drain electrodes 228 and 232.

In FIG. 7, a power electrode 278 having an island shape may be connected with the driving source electrode 228 and the power line 213 through a source contact hole 246 and a power contact hole 251, respectively. A connecting electrode 276, which may connect the driving TFT $T_D$ of lower substrate to the organic EL diode of upper substrate, may be formed within the pixel region P and may be connected with the driving drain electrode 232. The connecting electrode 276 and the power electrode 278 may be formed together during the same fabrication step using the same material(s). Although not shown in FIG. 7 but shown in FIG. 8F, the connecting electrode 276 may include an underlying connecting pattern having a pillar shape and may be made of an insulating material.

A data pad 238, a gate pad 218, and a power pad 219 may be formed at end portions of the data line 236, the gate line 212, and the power line 213, respectively. Furthermore, a data pad terminal 280 may be disposed to overlap the data pad 238, a gate pad terminal 282 may be disposed to overlap the gate pad 218, and a power pad terminal 284 may be disposed to overlap the power pad 219. The data pad, gate pad, and data pad terminals 280, 282, and 284 may be formed along with the connecting electrode 276 during the same processing step using the same material(s). Since the power line 213 may be formed with the gate line 212, a first link electrode 283a and second link electrodes 283b may be formed across and near the gate line 212 in order to prevent an electrical short between the gate line 212 and the power line 213. The first link electrode 283a may be formed to cross the gate line 212 and may be formed of the same material as the data line 236 during the same processing step. The second link electrodes 283b may be formed with the connecting electrode 276 using the same material, and may be formed to connect the first link electrode 283a to the power line 213. Thus, the power lines 213 along a vertical direction of adjacent pixel regions P may be electrically connected throughout the first and second link electrodes 283a and 283b.

In FIG. 7, since the data pad 238 and the power pad 219 may supply different signals, the data pad 238 and the power pad 219 may be formed to oppose each other. For example, if the data pad 238 is formed at an upper end of the data line 236, then the power pad 219 may be formed at a bottom end of the power line 213.

An exemplary fabrication process of forming a lower panel of the dual panel-type active matrix OELD device of FIG. 7 will be explained in detail with reference to FIGS. 8A–8F, 9A–9F, 10A–10F, and 11A–11F.

FIGS. 8A to 8F are cross sectional views along VIII—VIII of FIG. 7, FIGS. 9A to 9F are cross sectional views along IX—IX of FIG. 7, FIGS. 10A to 10F are cross sectional views along X—X of FIG. 7, and FIGS. 11A to 11F are cross sectional views along XI—XI of FIG. 7 all of which show exemplary fabricating processes of a lower panel of a dual panel-type active matrix OELD device according to the present invention;

In FIGS. 8A, 9A, 10A, and 11A, a first metal layer may be formed on a substrate 210, and then patterned to form a gate electrode 216, a gate pad 218, and a power pad 219. Although not shown in FIGS. 8A, 9A, 10A, and 11A but shown in FIG. 7, the gate line 212 and the power line 213 may also be formed on the substrate 210 after patterning of the first metal layer. According to the present invention, the first metal layer may have a low specific resistance, such as aluminum (Al).

Although not shown in FIGS. 8A, 9A, 10A, and 11A, a mask and a photosensitive photoresist may be used when patterning the first metal layer. After forming the first metal layer on the substrate 210, a photoresist layer may be formed on the first metal layer. Then, the mask may be disposed above the photoresist, and a light exposure step may be performed using the mask. Thus, after developing the photoresist and etching the first metal layer, the gate electrode 216, the gate pad 218, the power pad 219, the gate line 212, and the power line 213 may be formed.

In FIGS. 8B, 9B, 10B, and 11B, a first insulating layer 220, a undoped amorphous silicon (a-Si) layer, and a doped amorphous silicon (n+ a-Si) layer may be sequentially formed on the substrate 210 to cover the patterned metal, i.e., the gate electrode 216, the gate pad 218, and the power pad 219. The first insulating layer 220 may function as a gate insulator to electrically insulate and protect the underlying gate electrode 216, gate pad 218, the power pad 219, and the gate and power lines. Then, the undoped and doped amorphous silicon layers may be simultaneously patterned using a second mask process to form a semiconductor layer 224 over the gate electrode 216, wherein the semiconductor layer 224 may include an active layer 224a formed of undoped amorphous silicon and an ohmic contact layer 224b formed of doped amorphous silicon. In addition, the first insulating layer 220 may include an inorganic material selected from a group consisting of silicon nitride ($SiN_x$) and silicon oxide ($SiO_2$), for example.

In FIGS. 8C, 9C, 10C, and 11C, a second metal layer may be formed on the first insulating layer 220 and then patterned to form a data pad 238, a source electrode 228, and a drain electrode 232 using a third mask process. The source and drain electrodes 228 and 232 may be formed to contact the ohmic contact layer 224b and may be spaced apart from each other across the gate electrode 216. In addition, the data line 236 (in FIG. 7) may be formed during formation of the source and drain electrodes 228 and 232. Next, the data pad 238 may be disposed within the data pad region to electrically communicate with the data line. As previously described, the data pad 238 may be disposed at the end of the data line along an opposite direction to the power pad 219. The second metal layer may include metallic material having a high chemical resistance, such as molybdenum (Mo), titanium (Ti), chromium (Cr), and tungsten (W).

Figure 8A:
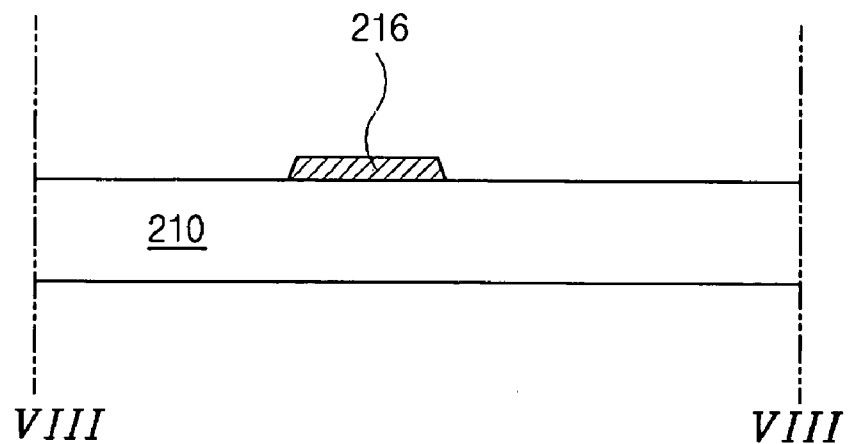
FIGS. 8A to 8F are cross sectional views along VIII—VIII of FIG. 7 showing exemplary fabricating processes of a lower panel of a dual panel-type active matrix OELD device according to the present invention.
Figure 8B:
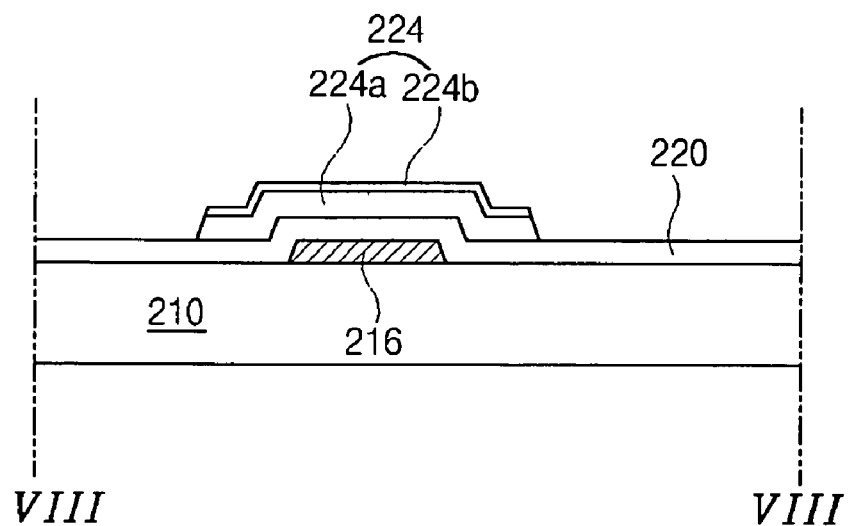
Figure 8C:
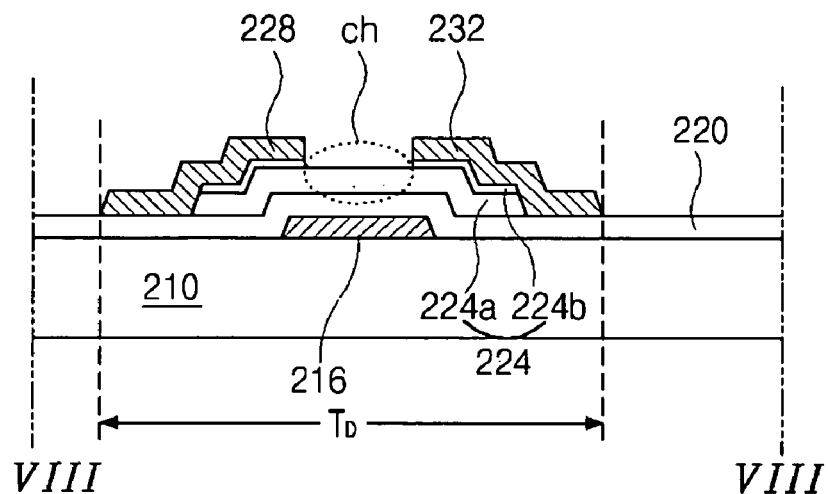
Figure 8D:
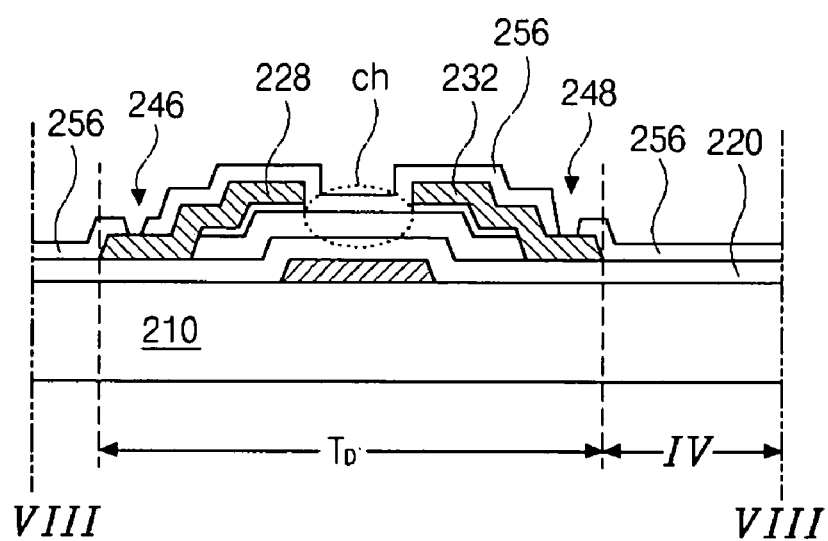
Figure 8E:
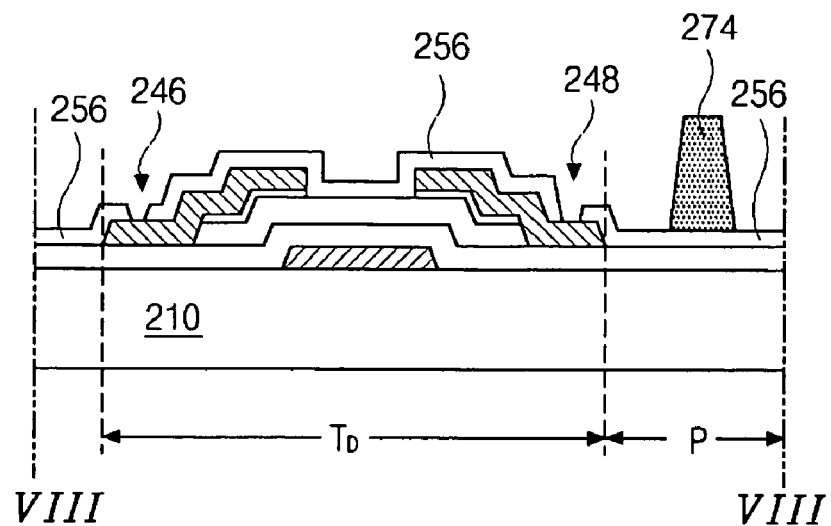
Figure 8F:
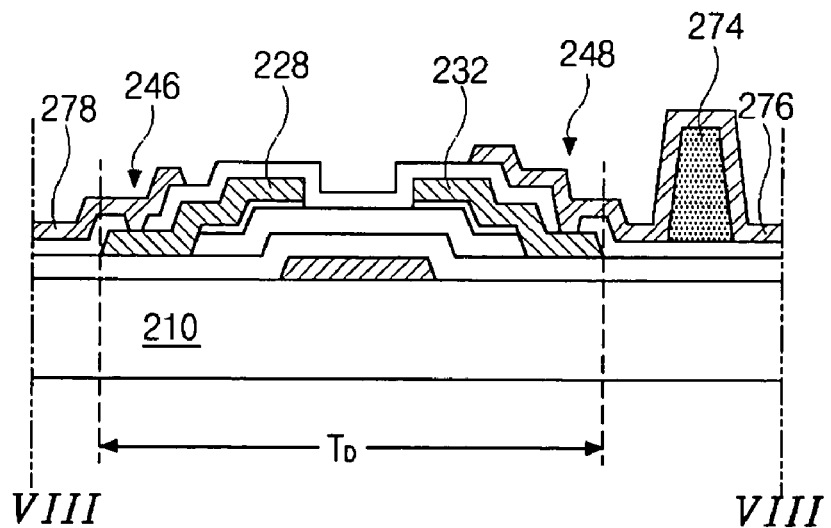
Figure 9A:
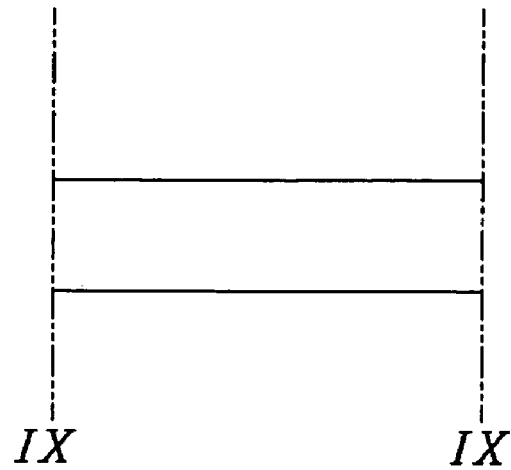
FIGS. 9A to 9F are cross sectional views along IX—IX of FIG. 7 showing exemplary fabricating processes of a lower panel of a dual panel-type active matrix OELD device according to the present invention.
Figure 9B:
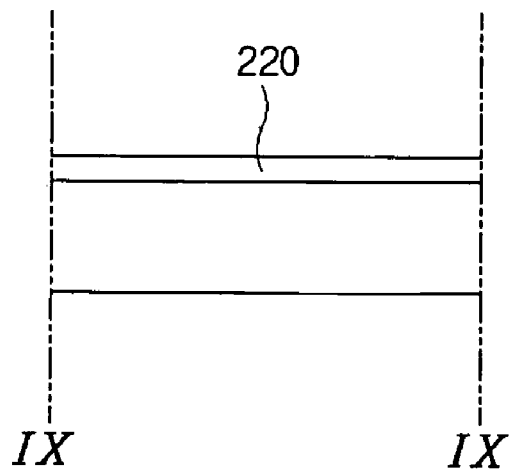
Figure 9C:
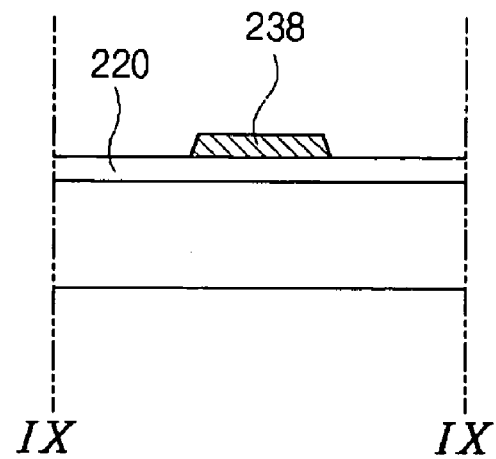
Figure 9D:
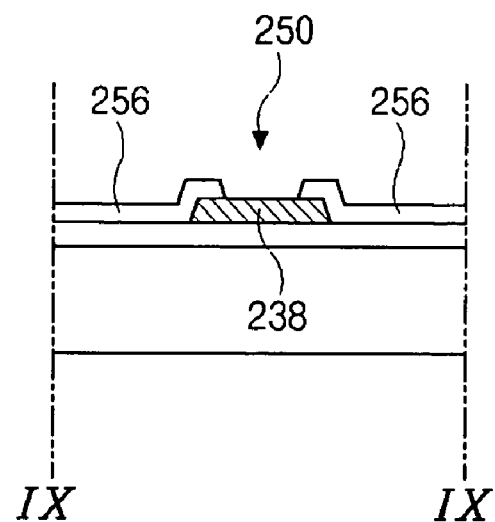
Figure 9E:
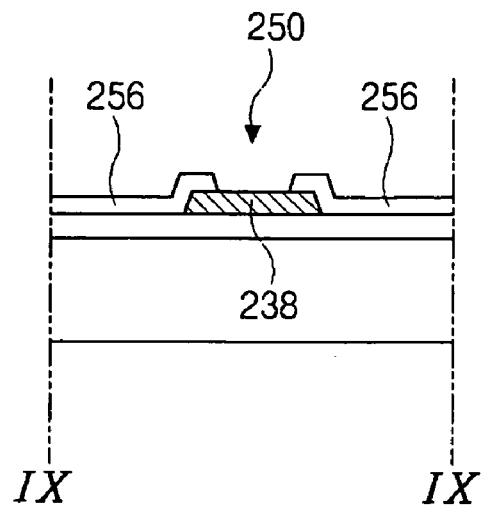
Figure 9F:
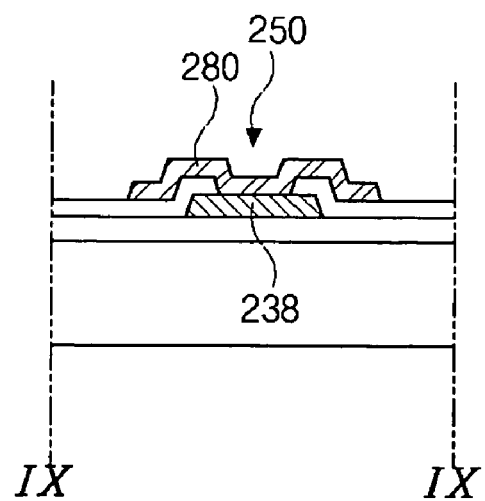
Figure 10A:
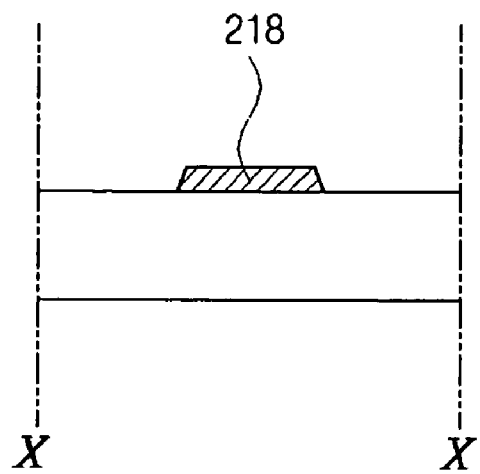
FIGS. 10A to 10F are cross sectional views along X—X of FIG. 7 showing exemplary fabricating processes of a lower panel of a dual panel-type active matrix OELD device according to the present invention.
Figure 10B:
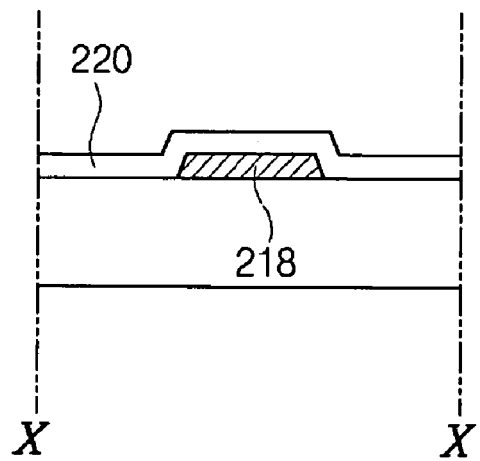
Figure 10C:
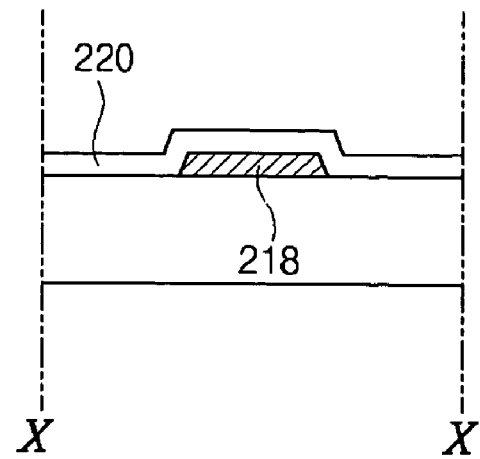
Figure 10D:
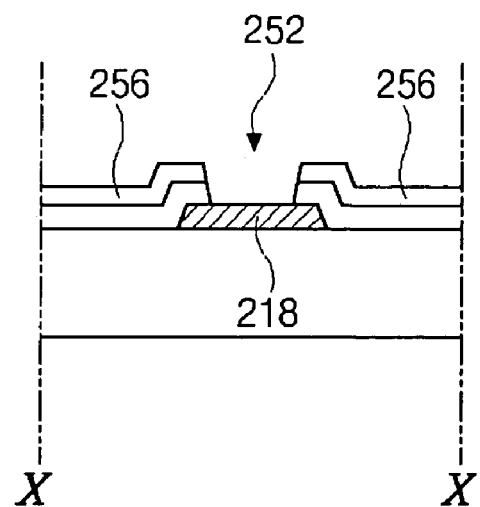
Figure 10E:
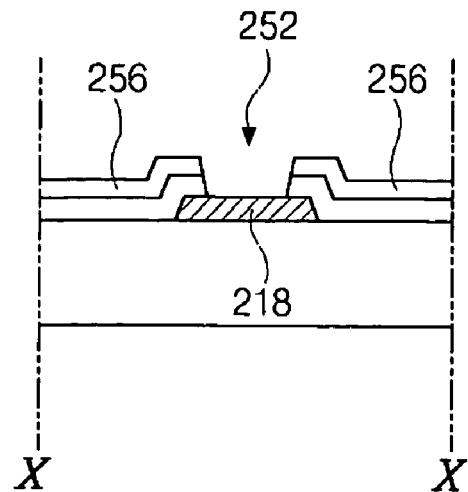
Figure 10F:
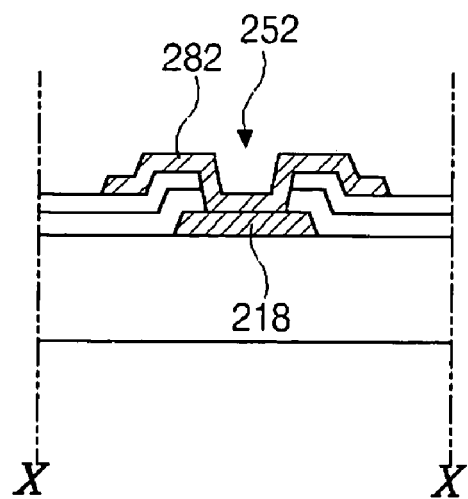
Figure 11A:
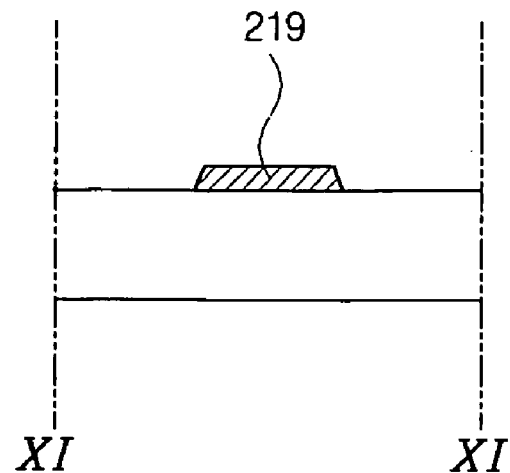
FIGS. 11A to 11F are cross sectional views along XI—XI of FIG. 7 showing exemplary fabricating processes of a lower panel of a dual panel-type active matrix OELD device according to the present invention.
Figure 11B:
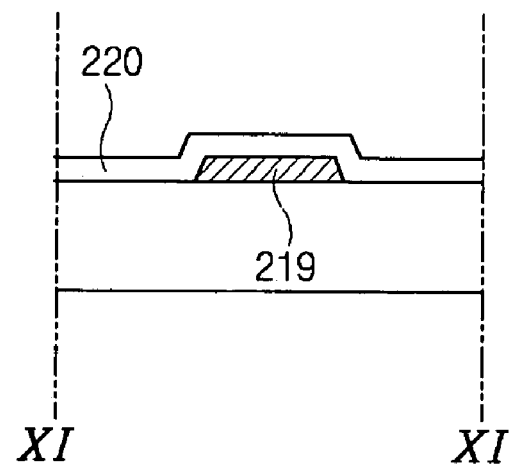
Figure 11C:
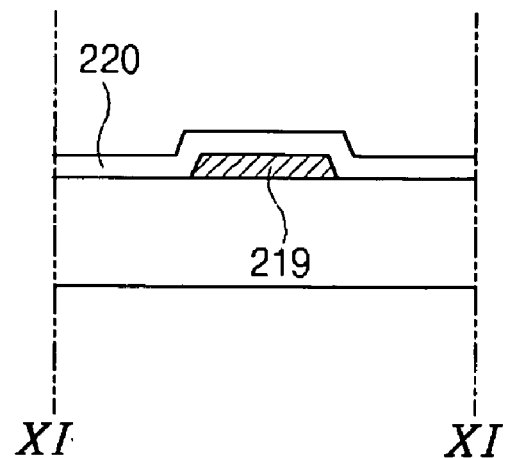
Figure 11D:
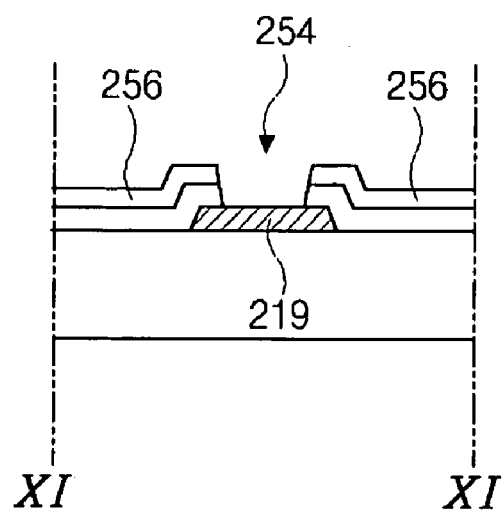
Figure 11E:
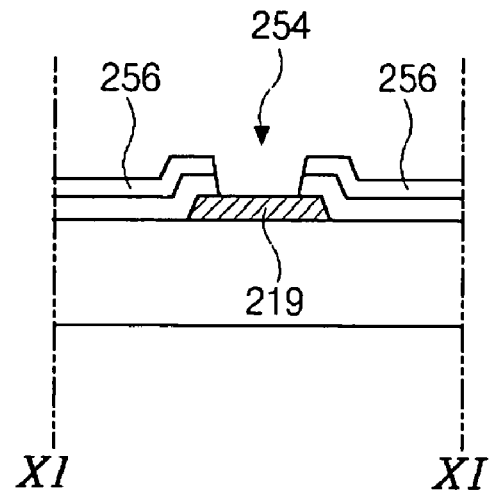
Figure 11F:
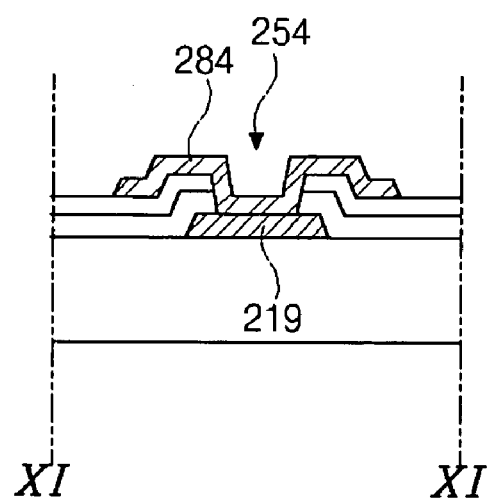

After forming the source and drain electrodes 228 and 232, a portion of the ohmic contact layer 224b exposed between the source and drain electrodes 228 and 232 may be removed using the source and drain electrodes 228 and 232 as a mask. Accordingly, a portion of the active layer 224a may be exposed, thereby forming a channel ch between the source and drain electrodes 228 and 232. Accordingly, a driving thin film transistor $T_D$ including the gate electrode 216, the semiconductor layer 224, the source electrode 228, and the drain electrode 232 may be formed, as shown in FIG. 8C.

In FIGS. 8D, 9D, 10D, and 11D, a second insulating layer 256 may be formed on the first insulating layer 220 to cover the thin film transistor $T_D$ and the data pad 238 and to overlap the gate pad 218 and the power pad 219. Then, the second insulating layer 256 may be patterned using a fourth mask process, thereby forming a source contact hole 246, a drain contact hole 248, a data pad contact hole 250, a gate pad contact hole 252, and a power pad contact hole 254. When forming the gate pad and power pad contact holes 252 and 254, the underlying first insulating layer 220 may also be patterned, whereby the gate pad and power pad contact holes 252 and 254 may penetrate both the first and second insulating layers 220 and 256. Thus, the source contact hole 246 may correspond to the source electrode 228, the drain contact hole 248 may correspond to the drain electrode 232, the data pad contact hole 250 may correspond to the data pad 238, the gate pad contact hole 252 may correspond to the gate pad 218, and the power pad contact hole 254 may correspond to the power pad 219. The second insulation layer 256 may include one of an organic material and an inorganic material or may include a multiple layer structure. However, the insulator contacting the thin film transistor $T_D$ may be an inorganic material, such as silicon nitride ($SiN_x$) or silicon oxide ($SiO_2$).

In FIGS. 8E, 9E, 10E, and 11E, a connecting pattern 274 having a pillar shape may be formed on the second insulating layer 256 within the pixel region P, wherein the connecting pattern 274 may be formed by patterning an organic insulating material using a fifth mask, and may correspond in position to the second electrode of the organic EL diode. The connecting pattern 274 may have a height more than a corresponding height of the thin film transistor $T_D$.

In FIGS. 8F, 9F, 10F, and 11F, a third metallic layer may be formed on the second insulating layer 256 to cover the connecting pattern 274, and then patterned using a sixth mask process, thereby forming a connecting electrode 276, a power electrode 278, a data pad terminal 280, a gate pad terminal 282, and a power pad terminal 284. The connecting electrode 276 may overlap the connecting pattern 274 within the pixel region and may contact the drain electrode 232 through the drain contact hole 248. The power electrode 278 may contact the source electrode 228 though the source contact hole 246, and may electrically connect the source electrode 228 to the power line 213, as shown in FIG. 7. In addition, the data pad terminal 280 may contact the data pad 238 through the data pad contact hole 250, the gate pad terminal 282 may contact the gate pad 218 through the gate pad contact hole 252, and the power pad terminal 284 may contact the power pad 219 through the power pad contact hole 254.

Figure 12:
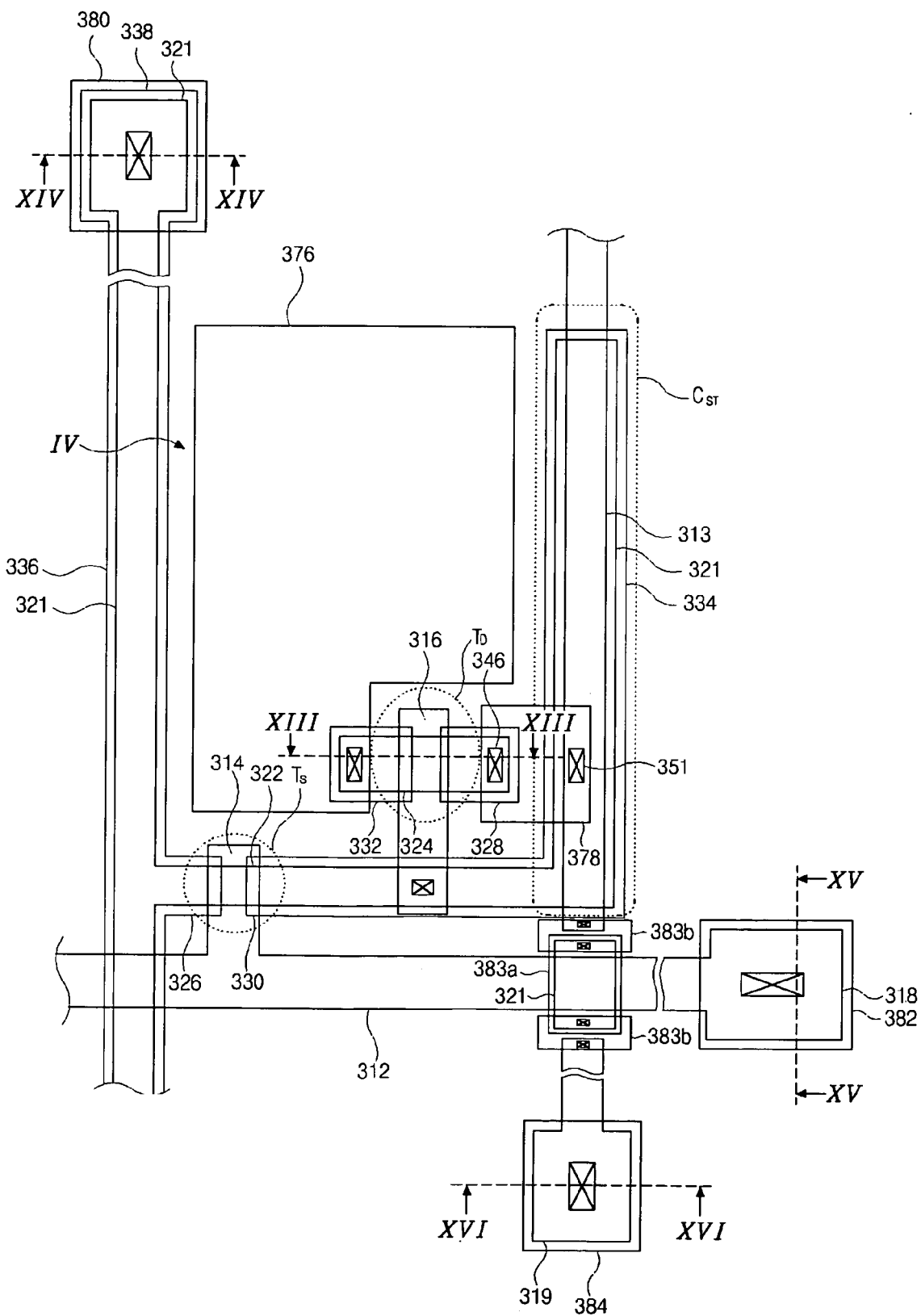
FIG. 12 is a plan view of another exemplary basic pixel structure of a lower panel of a dual panel-type active matrix OELD device according the present invention.

FIG. 12 is a plan view of another exemplary basic pixel structure of a lower panel of a dual panel-type active matrix OELD device according the present invention. In FIG. 12, an active matrix OLED device may include inverted stagger type thin film transistors, wherein a gate line 312 may be disposed along a first direction, and a data line 336 and a power line 313, which are spaced apart from each other, may be disposed along a second direction to perpendicularly cross the gate line 312. Accordingly, a pixel region P may be defined between the gate line 312 and the spaced apart data line 336 and power supply line 313. In addition, a switching thin film transistor (TFT) $T_S$ may be disposed adjacent to where the gate line 312 and the data line 336 cross each other, and may include a switching gate electrode 314 that extends from the gate line 312, a switching source electrode 326 that extends from the data line 336, a switching drain electrode 330 that may be spaced apart from the switching source electrode 326, and a switching semiconductor layer 322 disposed above the switching gate electrode 314. Unlike the lower panel of FIG. 7, the semiconductor layer 322 of FIG. 12 may extend beneath the source and drain electrodes 326 and 330.

In FIG. 12, the power line 313 may be formed with the gate line 312 during the same processing step using the same material. Furthermore, a capacitor electrode 334 may perpendicularly extend from the drain electrode 330 and may be disposed above the power line 313. Thus, the capacitor electrode 334 may constitute a storage capacitor $C_{ST}$ with a portion of the power line 313 overlapped by the capacitor electrode 334. In addition, a semiconductor pattern 321 may extend from the semiconductor layer 322 and may be formed beneath the capacitor electrode 334, wherein the semiconductor pattern 321 and the capacitor electrode 334 may be formed during the same patterning process so that they have the same pattern shape. Furthermore, the semiconductor pattern 321 may also be disposed beneath the data line 336 and may have the same pattern shape as the data line 336.

In FIG. 12, a driving TFT $T_D$ may be connected to the switching TFT $T_S$ and the power line 313, and may include a driving gate electrode 316, a driving source electrode 328, a driving drain electrode 332, and a driving semiconductor layer 324. The driving gate electrode 316 may be connected with the switching drain electrode 330 and may be formed of the same material as the gate line 312 during the same fabrication step. The driving source and drain electrodes 328 and 332 may overlap side portions of the driving gate electrode 316, and may be formed of the same material as the data line 336. Since the driving source and drain electrodes 328 and 332 may be formed with the data line 336 during the same processing step, the driving semiconductor layer 324 may be disposed not only above the driving gate electrode 316 but also beneath the source and drain electrodes 328 and 332.

Figure 13A:
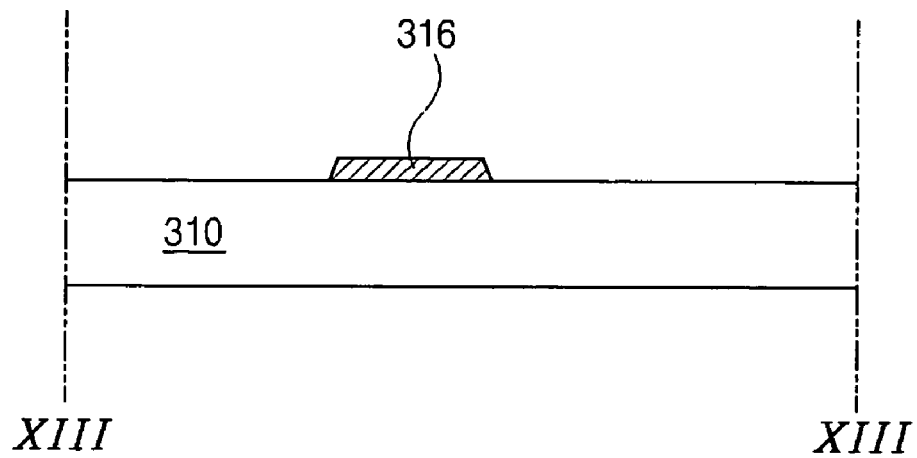
FIGS. 13A to 13E are cross sectional views along XIII—XIII of FIG. 12 showing exemplary fabricating processes of a lower panel of a dual panel-type active matrix OELD device according to the present invention.

In FIG. 12, a power electrode 378 having an island shape may be connected with the driving source electrode 328 and the power line 313 through a source contact hole 346 and a power contact hole 351, respectively. In addition, a connecting electrode 376, which connects the driving TFT $T_D$ of lower substrate to the organic EL diode of upper substrate, may be formed within the pixel region P and may be connected with the driving drain electrode 332. The connecting electrode 376 and the power electrode 378 may be formed together during the same fabrication step using the same material. Although not shown in FIG. 12 but shown in FIG. 13F, the connecting electrode 376 may include an underlying connecting pattern that may have a pillar shape made of an insulating material.

According to the present invention, a portion of the power line 313 may function as a first capacitor electrode for the storage capacitor $C_{ST}$, and the storage capacitor $C_{ST}$ may also include the capacitor electrode 334, which may extend from the switching drain electrode 330, to function as a second electrode. More particularly, an area where the capacitor electrode 334 overlaps the power line 313 may constitute the storage capacitor $C_{ST}$.

In FIG. 12, a data pad 338, a gate pad 318, and a power pad 319 may be formed at the ends of the data line 336, the gate line 312, and the power line 313, respectively. Furthermore, a data pad terminal 380 may be disposed to overlap the data pad 338, a gate pad terminal 382 may be disposed to overlap the gate pad 318, and a power pad terminal 384 may be disposed to overlap the power pad 319. The data pad, gate pad, and data pad terminals 380, 382, and 384 may be formed with the connecting electrode 376 during the same processing step using the same material. In addition, the data pad 338 may be formed with the data line 336 during the same processing step, whereby the semiconductor pattern 321 may also be formed beneath the data pad 338 with the same pattern shape.

Meanwhile, since the power line 313 maybe formed with the gate line 312, a first link electrode 383a and second link electrodes 383b may be formed across and near the gate line 312 in order to prevent an electrical short between the gate line 312 and the power line 313. The first link electrode 383a may be formed to cross the gate line 312 and may be formed of the same material as the data line 336 during the same processing step, whereby the semiconductor pattern 321 may also be disposed beneath the first link electrode 383a. The second link electrodes 383b may be formed with the connecting electrode 376 using the same material, and may be formed to connect the first link electrode 383a to the power line 313. Thus, the power lines 313 along a vertical direction of adjacent pixel regions P may be electrically connected throughout the first and second link electrodes 383a and 383b.

In FIG. 12, since the data pad 338 and the power pad 319 may supply different signals to the data line 336 and the power line 313, respectively, the data pad 338 may be formed in an end opposite to the power pad 319. For example, if the data pad 338 is formed at an upper end of the data line 336, then the power pad 319 may be formed at a bottom end of the power line 313.

An exemplary fabrication process of a lower panel of the dual panel-type active matrix OELD device of FIG. 12 will be explained in detail with reference to FIGS. 13A–13F, 14A–14F, 15A–15F, and 16A–16F.

FIGS. 13A to 13E are cross sectional views along XIII—XIII of FIG. 12, FIGS. 14A to 14E are cross sectional views along XIV—XIV of FIG. 12, and FIGS. 15A to 15E are cross sectional views along XV—XV of FIG. 12, and FIGS. 16A to 16E are cross sectional views along XVI—XVI of FIG. 12 all which show an exemplary fabricating processes of a lower panel of a dual panel-type active matrix OELD device according to the present invention.

In FIGS. 13A, 14A, 15A, and 16A, a first metal layer may be formed on a substrate 310 and then patterned to form a gate electrode 316, a gate pad 318, and a power pad 319. Although not shown in FIGS. 13A, 14A, 15A, and 16A but shown in FIG. 12, the gate line 312 and the power line 313 may also be formed on the substrate 310 after the patterning of the first metal layer. According to the present invention, the first metal layer may have a low specific resistance, such aluminum (Al).

Although not shown in FIGS. 13A, 14A, 15A, and 16A, a mask and a photosensitive photoresist may be used when patterning the first metal layer. After forming the first metal layer on the substrate 310, a photosensitive photoresist layer may be formed on the first metal layer. Then, the mask may be disposed above the photoresist, and a light exposure may be performed using the mask. Then, after developing the photoresist and etching the first metal layer, the gate electrode 316, the gate pad 318, the power pad 319, the gate line 312, and the power line 313 may be formed.

In FIGS. 13B, 14B, 15B, and 16B, a first insulating layer 320, an undoped amorphous silicon (a-Si) layer, a doped amorphous silicon (n+ a-Si) layer, and a second metal layer may be sequentially formed on the substrate 310 to cover the patterned metal, e.g., the gate electrode 316, the gate pad 318, and the power pad 319. The first insulating layer 320 may function as a gate insulator that electrically insulates and protects the underlying gate electrode 316, gate pad 318, the power pad 319, and the gate and power lines.

Then, the undoped and doped amorphous silicon layers and the second metal layer may be simultaneously patterned using a second mask process to form a semiconductor layer 324 over the gate electrode 316, source and drain electrodes 328 and 332 on the semiconductor layer 324, and a data pad 338. Furthermore, a data line 336 (in FIG. 7) may be formed to cross the gate line 312, wherein the data pad 338 may be disposed at the end of the data line along an opposite position to the power pad 319. When forming the source and drain electrodes 328 and 332, a diffraction exposure method may be employed, which will be explained with reference to FIGS. 17A–17D.

Figure 13B:
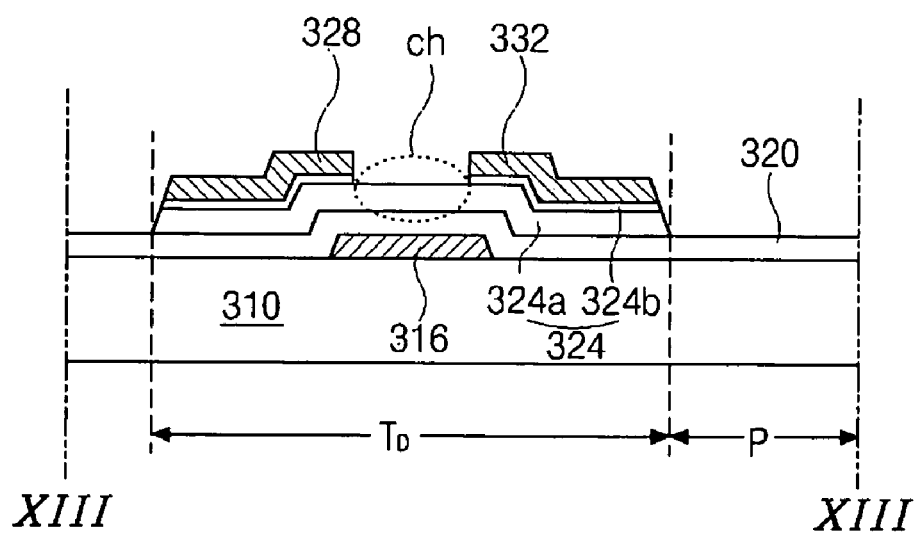
Figure 14A:
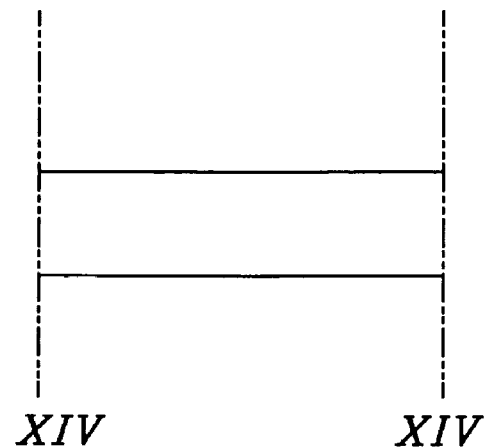
FIGS. 14A to 14E are cross sectional views along XIV—XIV of FIG. 12 showing exemplary fabricating processes of a lower panel of a dual panel-type active matrix OELD device according to the present invention.
Figure 14B:
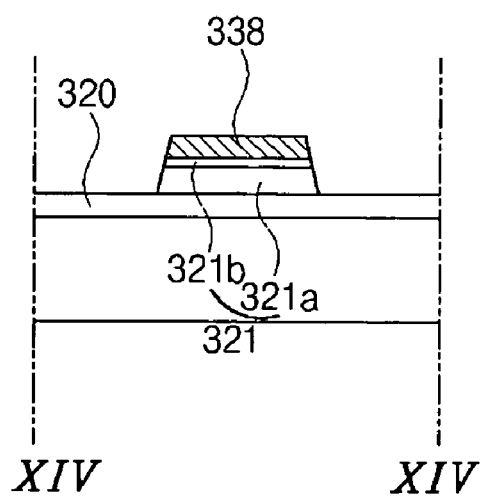
Figure 14C:
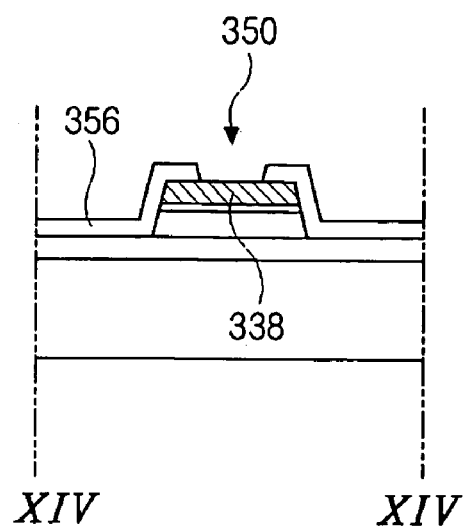
Figure 14D:
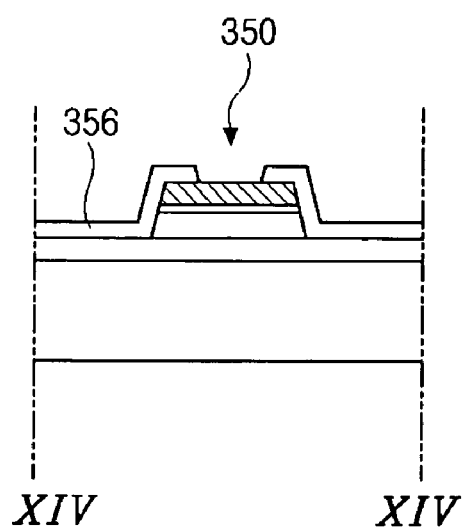
Figure 14E:
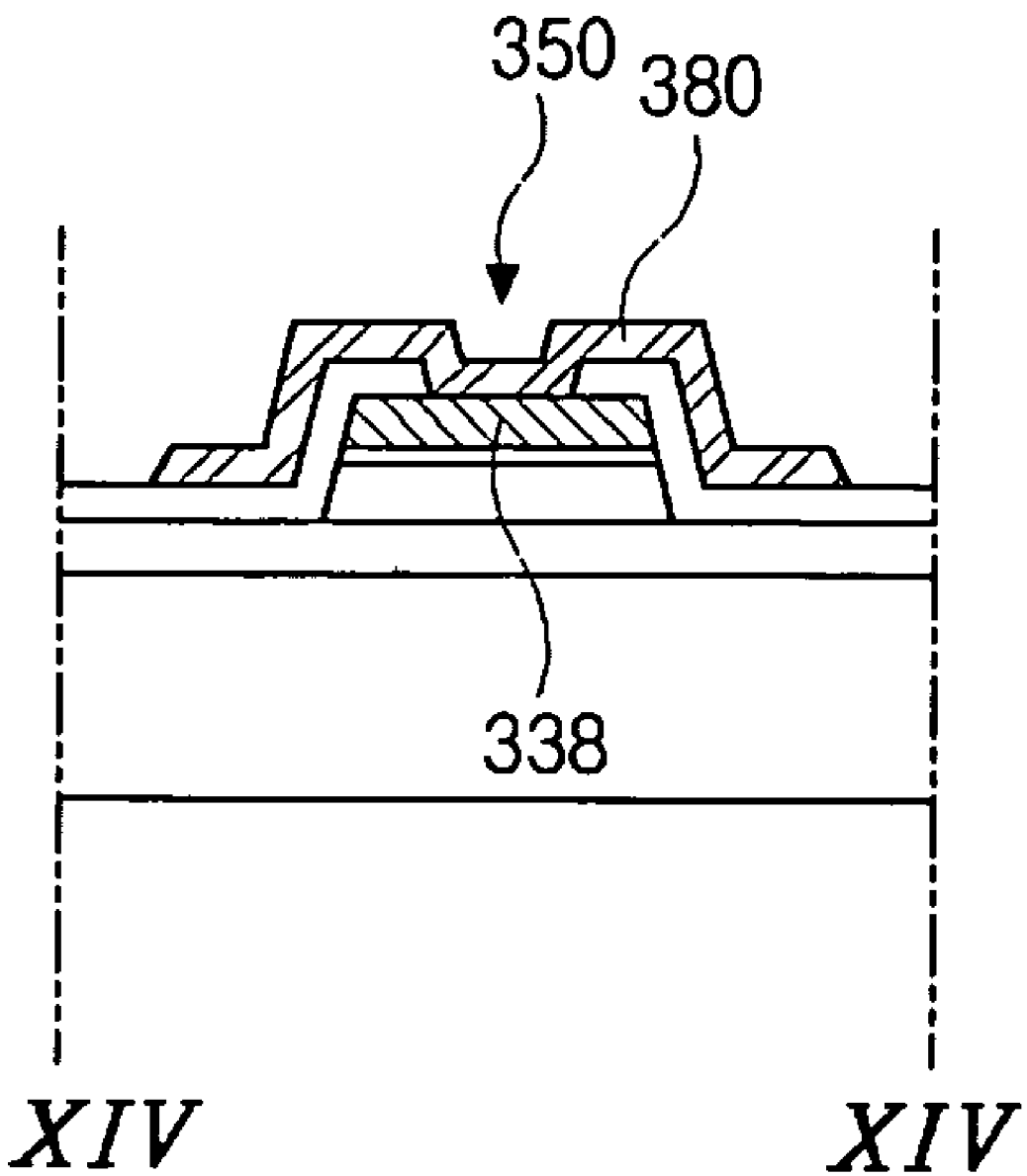
Figure 15A:
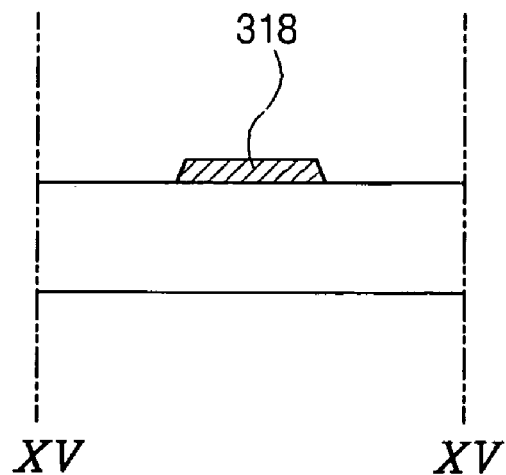
FIGS. 15A to 15E are cross sectional views along XV—XV of FIG. 12 showing exemplary fabricating processes of a lower panel of a dual panel-type active matrix OELD device according to the present invention.
Figure 15B:
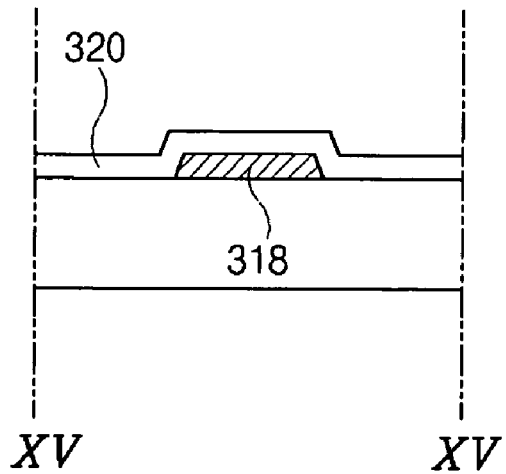
Figure 15C:
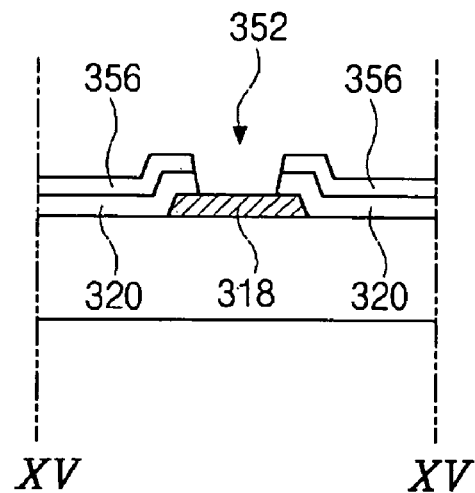
Figure 15D:
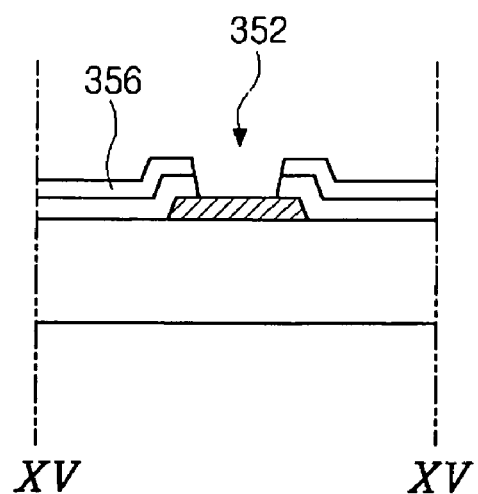
Figure 15E:
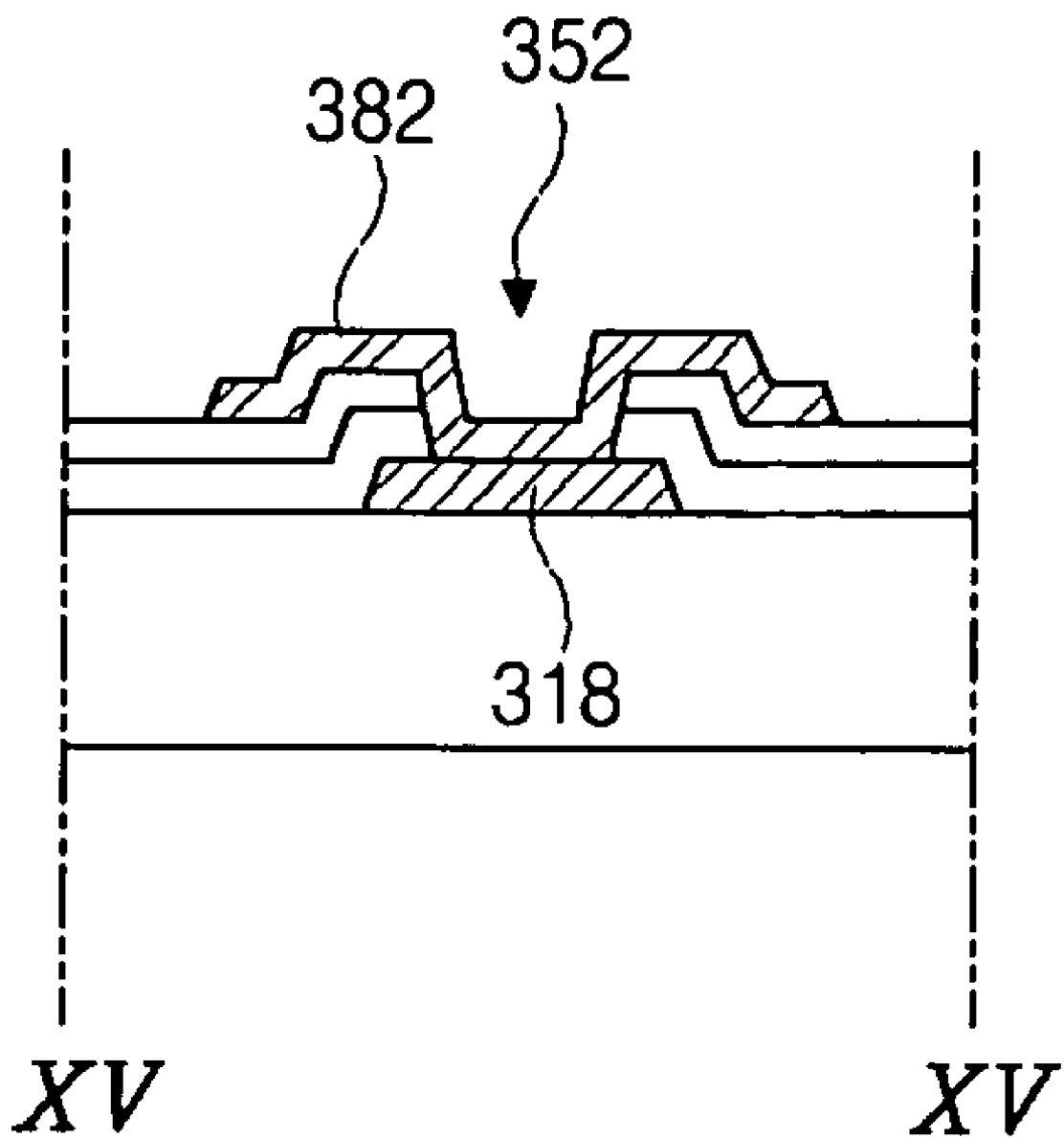
Figure 16A:
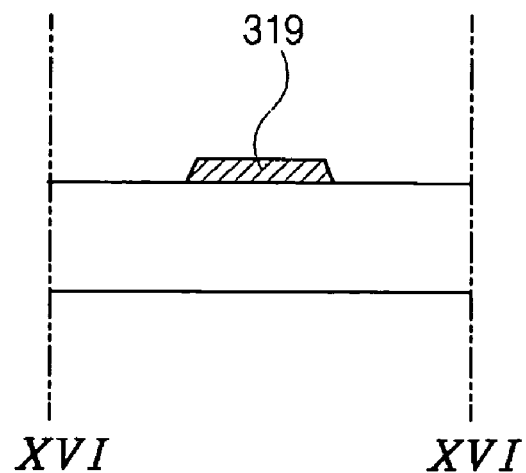
FIGS. 16A to 16E are cross sectional views along XVI—XVI of FIG. 12 showing exemplary fabricating processes of a lower panel of a dual panel-type active matrix OELD device according to the present invention.
Figure 16B:
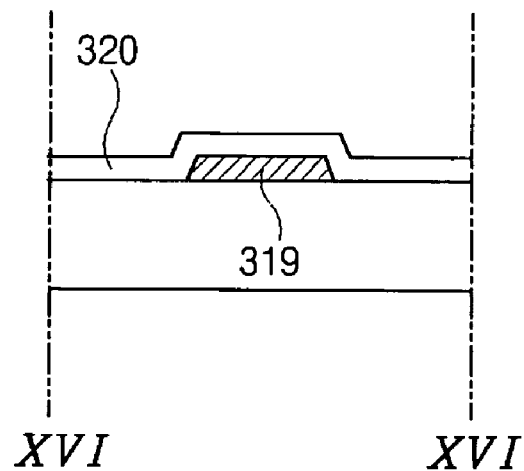
Figure 16C:
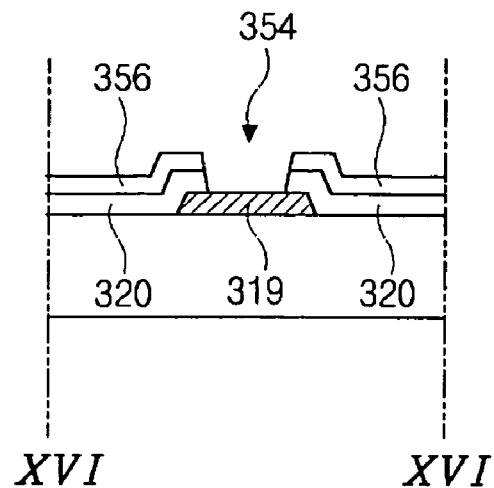
Figure 16D:
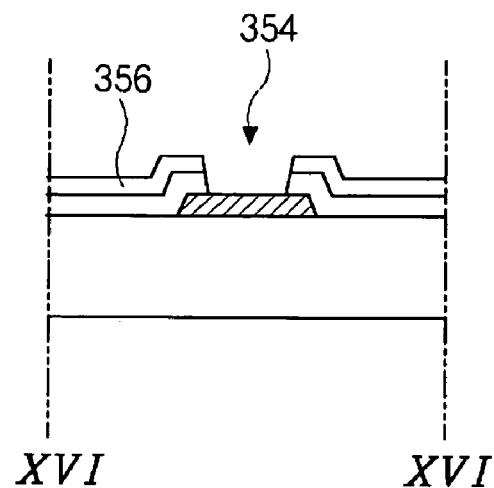
Figure 16E:
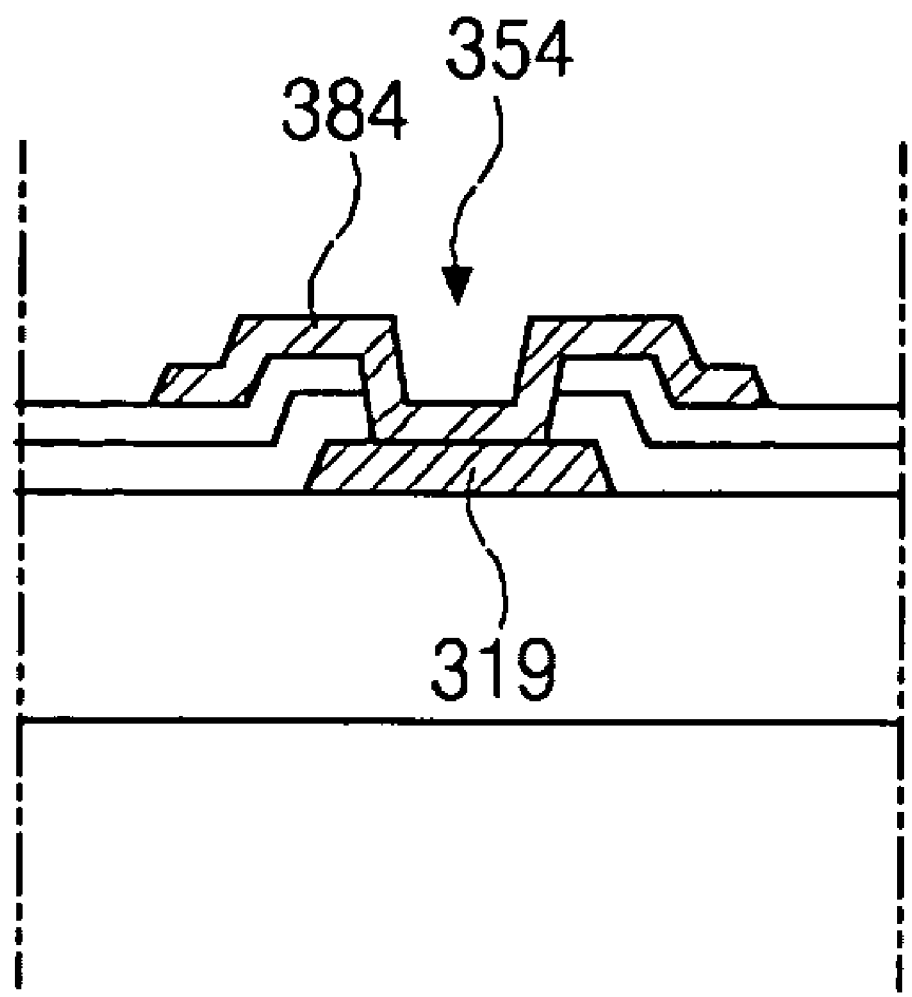

Since the silicon layers and the second metal layer may be formed during the same mask process, the semiconductor layer 324 may extend beneath the source and drain electrodes 328 and 332, as shown in FIG. 13B. Additionally, a semiconductor pattern 321 may be disposed beneath the data pad 338 having the same pattern shape, as shown in FIG. 14B. The second metal layer may include metallic material having a high chemical resistance, such as molybdenum (Mo), titanium (Ti), chromium (Cr), and tungsten (W). The semiconductor layer 324 may include an active layer 324$a$ formed of undoped amorphous silicon and an ohmic contact layer 324$b$ formed of doped amorphous silicon. In addition, the semiconductor pattern 321 may include an undoped amorphous silicon pattern 321$a$ and a doped amorphous silicon pattern 321$b$. The first insulating layer 320 may include an inorganic material selected from a group consisting of silicon nitride ($SiN_x$) and silicon oxide ($SiO_2$). Meanwhile, the source and drain electrodes 328 and 332 may be formed to contact the ohmic contact layer 324$b$ and may be spaced apart from each other across the gate electrode 316.

Figure 13C:
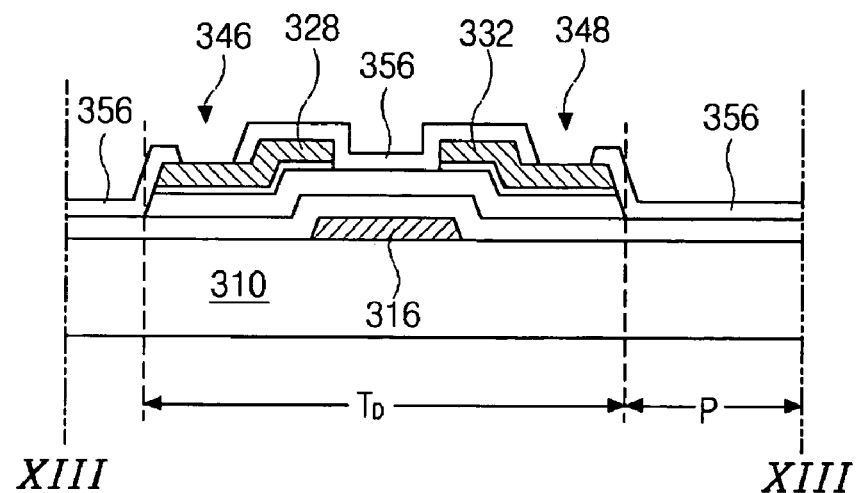
Figure 13D:
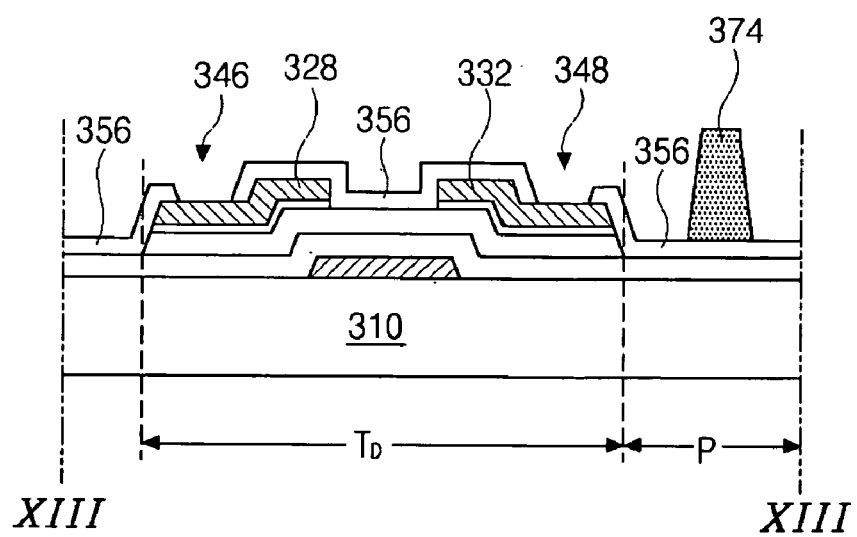
Figure 13E:
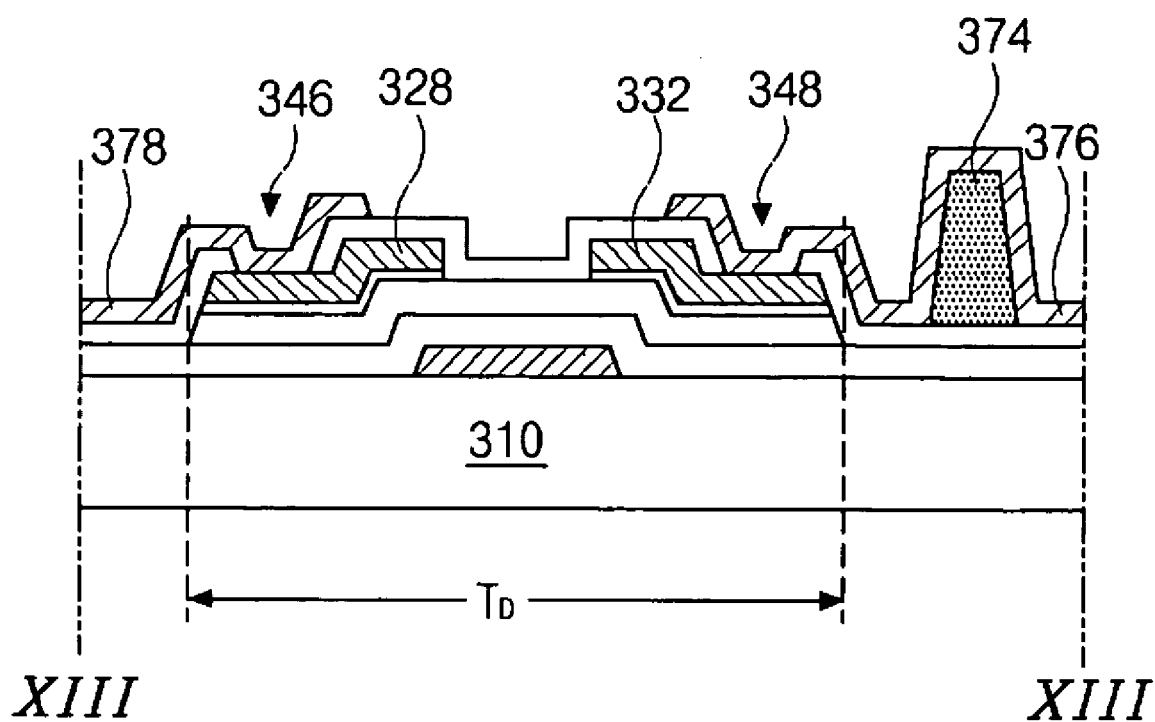

After forming the source and drain electrodes 328 and 332, a portion of the ohmic contact layer 324$b$ exposed between the source and drain electrodes 328 and 332 may be removed using the source and drain electrodes 328 and 332 as a mask. Thus, a portion of the active layer 324$a$ may be exposed, thereby forming a channel ch between the source and drain electrodes 328 and 332. A detailed explanation of forming the channel ch will be explained with reference to FIGS. 17A–17D. Accordingly, a driving thin film transistor $T_D$ including the gate electrode 316, the semiconductor layer 324, the source electrode 328, and the drain electrode 332 may be formed, as shown in FIG. 13C.

In FIGS. 13C, 14C, 15C, and 16C, a second insulating layer 356 maybe formed along an entire surface of the first insulating layer 320 to cover the thin film transistor TD and the data pad 338. Then, the first and second insulating layers 320 and 356 may be patterned using a third mask process, thereby forming a source contact hole 346, a drain contact hole 348, a data pad contact hole 350, a gate pad contact hole 352, and a power pad contact hole 354. The drain and source contact holes 348 and 346 and the data pad contact holes 350 may penetrate the second insulating layer 356, while the gate pad and power pad contact holes 352 and 354 may penetrate both the first and second insulating layers 320 and 356. The source contact hole 346 may correspond to the source electrode 328, the drain contact hole 348 may correspond to the drain electrode 332, the data pad contact hole 350 may correspond to the data pad 338, the gate pad contact hole 352 may correspond to the gate pad 318, and the power pad contact hole 354 may correspond to the power pad 3.19. In addition, the second insulation layer 356 may be one of an organic material and an inorganic material, or may include a multiple layer structure. However, the insulator contacting the thin film transistor $T_D$ may be the inorganic material, such as silicon nitride ($SiN_x$) or silicon oxide ($SiO_2$).

In FIGS. 13D, 14D, 15D, and 16D, a connecting pattern 374 having a pillar shape may be formed on the second insulating layer 356 and within the pixel region P. The connecting pattern 374 may be formed by patterning an organic insulating material using a fourth mask, and may correspond in position to the second electrode of the organic EL diode. In addition, the connecting pattern 374 may have a height more than a corresponding height of the thin film transistor $T_D$.

In FIGS. 13E, 14E, 15E, and 16E, a third metallic layer may be formed on the second insulating layer 356 to cover the connecting pattern 374, and then patterned using a fifth mask process, thereby forming a connecting electrode 376, a power electrode 378, a data pad terminal 380, a gate pad terminal 382, and a power pad terminal 384. The connecting electrode 376 may overlap the connecting pattern 374 within the pixel region P and may contact the drain electrode 332 through the drain contact hole 348. The power electrode 378 may contact the source electrode 328 though the source contact hole 346, and may electrically connect the source electrode 328 to the power line 313, as shown in FIG. 12. The data pad terminal 380 may contact the data pad 338 through the data pad contact hole 350, the gate pad terminal 382 may contact the gate pad 318 through the gate pad contact hole 352, and the power pad terminal 384 may contact the power pad 319 through the power pad contact hole 354.

Figure 17A:
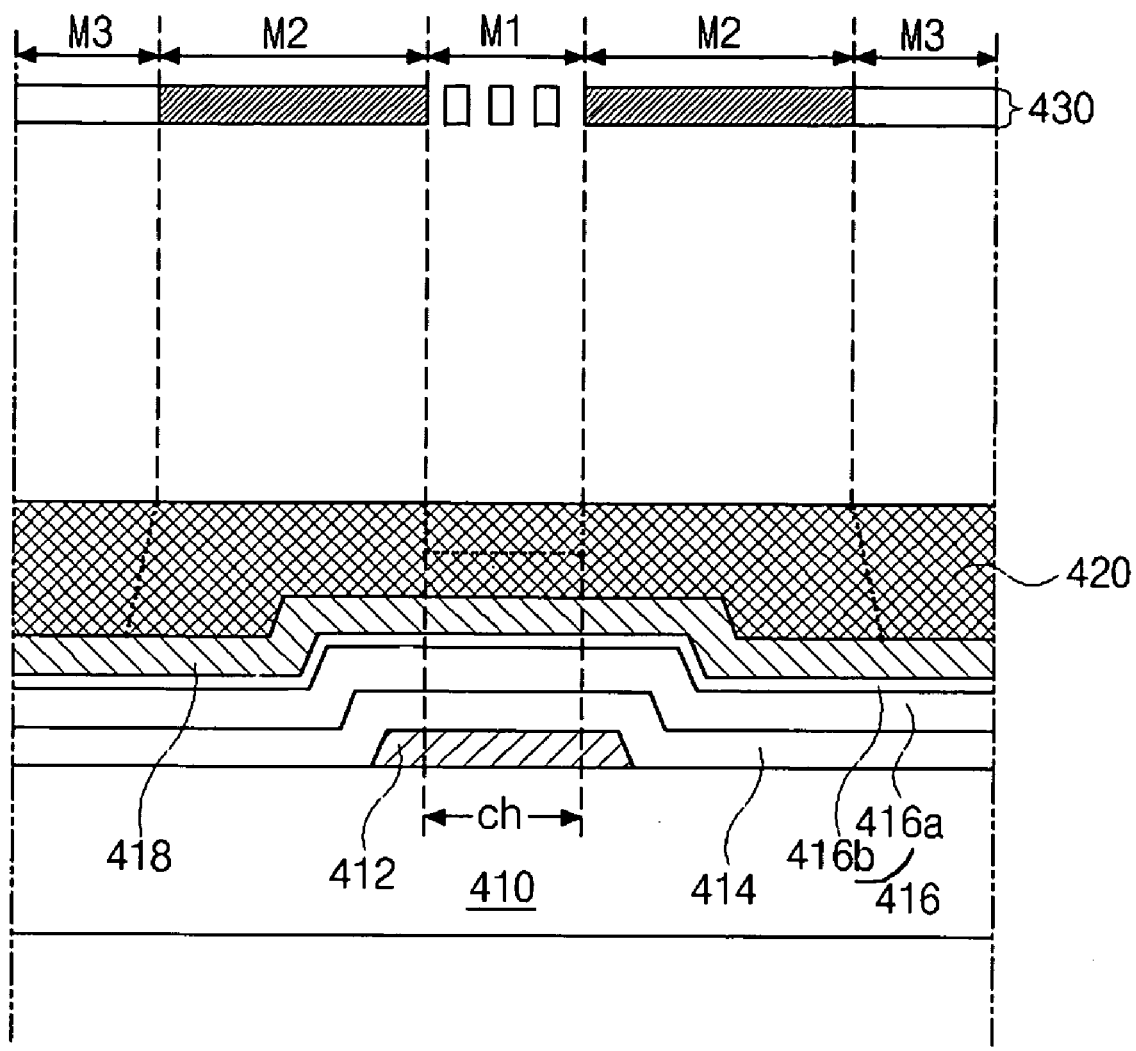
FIGS. 17A to 17D are cross sectional views showing exemplary fabrication processes for forming a thin film transistor using a diffraction exposure method according to the present invention.

FIGS. 17A to 17D are cross sectional views showing exemplary fabrication processes for forming a thin film transistor using a diffraction exposure method according to the present invention. In FIG. 17A, a gate electrode 412 may be first formed on a substrate 410 by patterning a first metal layer. Then, a first gate insulating layer 414, a semiconductor layer 416, and a second metal layer 418 may be sequentially formed on the substrate 410 to cover the gate electrode 412, wherein the semiconductor layer 416 may include an undoped amorphous silicon layer 416$a$ and a doped amorphous silicon layer 416$b$. Next, a photoresist 420 of a photosensitive material may be formed on the second metal layer 418, and a mask 430 may be located above the photoresist 420.

The photoresist 420 may be a positive type photosensitive material, wherein a portion exposed by light is removed during a developing process. The mask 430 may have a first portion M1, a plurality of second portions M2, and a plurality of third portions M3. The first portion M1 may include half-transmitting portions and may include a plurality of slits or a semitransparent film so that only a one-half portion of the light may pass through. The first portion M1 may correspond in position to a channel region ch of the thin film transistor. The second portions M2 may include shielding portions that may completely block the light during the exposure process and may correspond to the source and drain electrodes of the thin film transistor. The third portions M3 may include transmitting portions that allow the light to completely pass through and may correspond to the pixel region.

After disposing the mask 430 above the photoresist 420, a light exposure may be performed to the photoresist 420 using the mask 430. Accordingly, the light passing through the third portions M3 may fully irradiate the corresponding regions, while the light passing through the first portion M1 may weakly irradiates the corresponding regions.

Figure 17B:
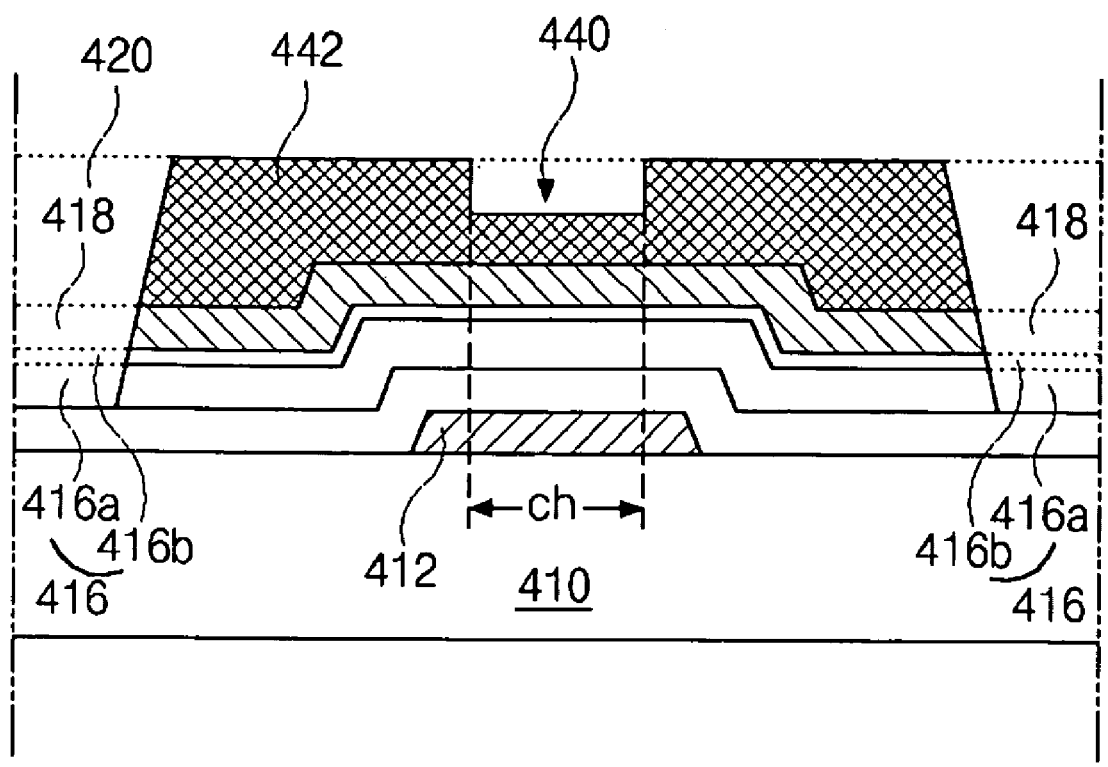

Therefore, as shown in FIG. 17B, after developing the photoresist 420, the fully irradiated portions of the photoresist 420 may be completely removed, and a portion corresponding to the first portion M1 of the mask 430 may be partially removed. The portions of the photoresist 420 corresponding to the second portions M2 may remain on the second metal layer 418, thereby forming a photoresist pattern 442 having an indentation 440 over the gate electrode 412. Then, exposed portions of the second metal layer 418 and underlying portions of the semiconductor layer 416 may be etched so that the metal and silicon patterns are only left beneath the photoresist pattern 442, as shown in FIG. 17B.

Figure 17C:
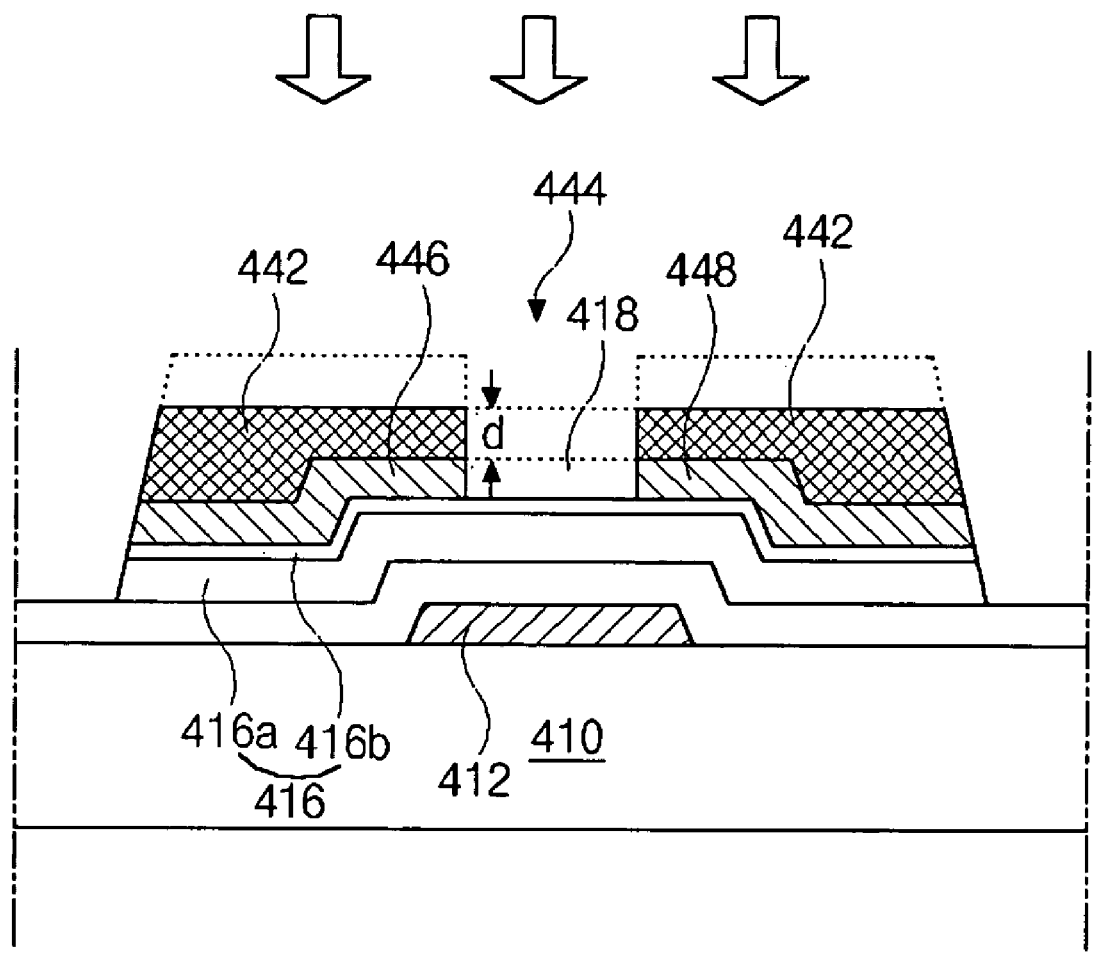

FIG. 17C shows a process step of ashing the photoresist pattern 442. The photoresist pattern 442 may be ashed so that portions of the photoresist pattern 442 may be partially removed as much as a thickness d until a portion of the patterned second metal layer 418 is exposed. Accordingly, the ashed photoresist pattern 442 may have an opening 444. Then, the exposed portion of the second metal layer 418 may be etched away so that a source electrode 446 and a drain electrode 448 may be formed to be spaced apart from each other across the gate electrode 412.

Figure 17D:
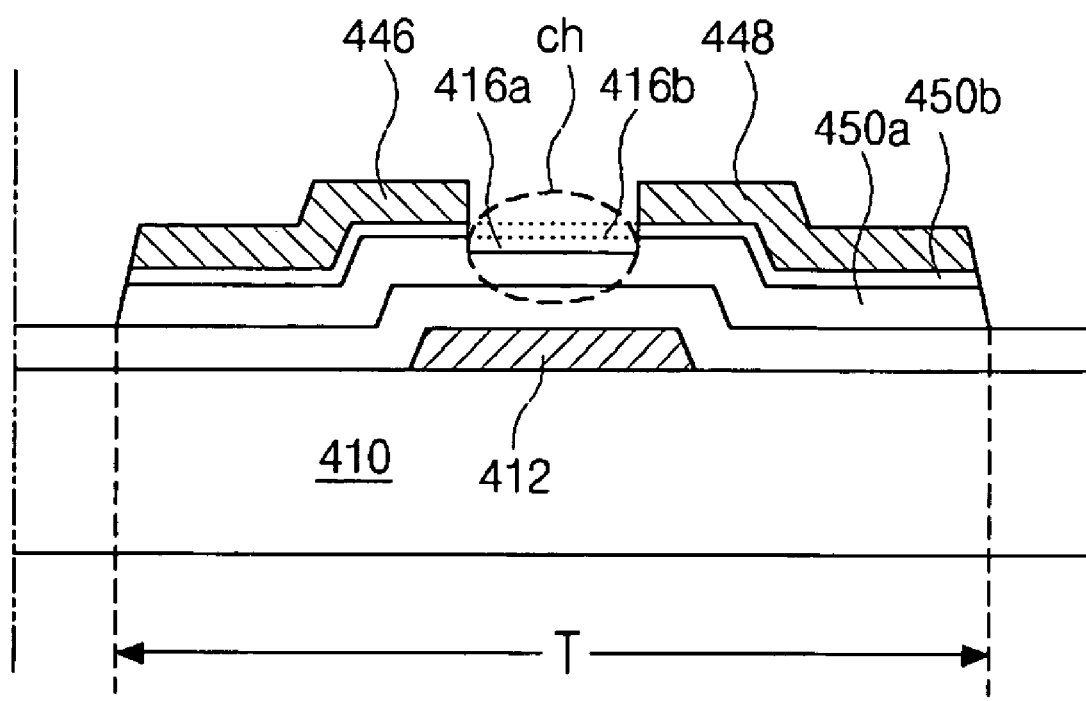

After forming the source and drain electrodes 446 and 448, the residual photoresist pattern 442 may be completely stripped, as shown in FIG. 17D. Then, a portion of the doped amorphous silicon layer 416b between the source and drain electrodes 446 and 448 may be removed until the underlying undoped amorphous silicon layer 416a is exposed, thereby forming the channel ch on the undoped amorphous silicon layer 416a. When removing the portion of the doped amorphous silicon layer 416b between the source and drain electrodes 446 and 448, the underlying undoped amorphous silicon layer 416a may be partially etched to completely eliminate the doped amorphous silicon in the channel ch. Accordingly, the undoped amorphous silicon layer 416a may function as an active layer 450a, and the doped amorphous silicon layer 4416b may function as an ohmic contact layer 450b. The gate electrode 412, the active layer 450a, the ohmic contact layer 450b, and the source and drain electrodes 446 and 448 may constitute a thin film transistor T. In the diffraction exposure method of FIGS. 17A–17D, the active and ohmic contact layers and the source and drain electrodes may be simultaneously formed during the same mask process.

According to the present invention, since the array layer and the organic EL diode may be formed on different substrates, high production efficiency may be achieved and manufacturing yields may be increased. Second, since the lower panel of the present invention may be utilized for an OELD device, reduction of design limitations of the thin film transistor and a high aperture ratio may be achieved. Third, since the inverted staggered-type thin film transistor may be implemented in the OELD devices, fabrication processes may be performed under a relative low temperature and reduced mask processes may be utilized.

It will be apparent to those skilled in the art that various modifications and variation can be made in the dual panel-type organic electroluminescent device and method for fabricating the dual panel-type organic electroluminescent device of the present invention without departing from the spirit or scope of the invention. Thus, it is intended that the present invention cover the modifications and variations of this invention provided they come within the scope of the appended claims and their equivalents.

What is claimed is:

1. A dual panel-type active matrix organic electroluminescent device, comprising:
    a gate line disposed along a first direction on a first substrate;
    a data line disposed along a second direction on the first substrate;
    a power line disposed along the second direction on the first substrate and spaced apart from the data line to define a pixel region with the gate and data lines, the power line and the gate line both formed of a same material directly on a same layer;
    a switching thin film transistor disposed on the first substrate near a crossing of the gate and data lines;
    a driving thin film transistor disposed on the first substrate near a crossing of the gate and power lines;
    a connecting pattern within the pixel region on the first substrate formed of at least one insulating layer; and
    a connecting electrode disposed within the pixel region on the first substrate to cover the connecting pattern and electrically interconnecting the driving thin film transistor to an organic electroluminescent diode.

2. The device according to claim 1, wherein the organic electroluminescent diode is disposed on a second substrate opposing the first substrate.

3. The device according to claim 1, further comprising a first link electrode formed across the gate line to interconnect the power lines along the second direction, wherein the first link electrode is formed of a same material as the data line.

4. The device according to claim 3, further comprising a second link electrode disposed near the gate line to interconnect the power lines along the second direction along with the first link electrode, wherein the second link electrode is formed of a same material as the connecting electrode during a same process step.

5. The device according to claim 1, further comprising a power electrode interconnecting the power line to the driving thin film transistor, wherein the power electrode is formed of a same material as the connecting electrode during a same process step.

6. The device according to claim 1, further comprising a gate pad at an end of the gate line, a data pad at an end of the data line, and a power pad at an end of the power line, wherein the data pad is disposed in a position opposite to the power pad.

7. The device according to claim 6, further comprising a gate pad terminal contacting the gate pad, a data pad terminal contacting the data pad, and a power pad terminal contacting the power pad, wherein the gate pad, data pad, and power pad terminals are formed of a same material as the connecting electrode during a same process step.

8. The device according to claim 6, further comprising a semiconductor pattern beneath the data pad and comprising a first pattern of undoped amorphous silicon and a second pattern of doped amorphous silicon.

9. The device according to claim 1, wherein the switching thin film transistor includes a switching gate electrode that extends from the gate line, a switching semiconductor layer disposed over the switching gate electrode, a switching source electrode that extends from the data line over the semiconductor layer, and a switching drain electrode spaced from the source electrode over the semiconductor layer.

10. The device according to claim 9, further comprising a capacitor electrode extending from the switching drain electrode over the power line.

11. The device according to claim 10, wherein the driving thin film transistor includes a driving gate electrode connected to the switching drain electrode, a driving semiconductor layer disposed over the driving gate electrode, a driving source electrode connected to the power electrode, and a driving drain electrode connected to the connecting electrode.

12. The device according to claim 11, further comprising a plurality of semiconductor patterns beneath the capacitor electrode, the data line, the switching source and drain electrodes, and the driving source and drain electrodes, wherein each of the semiconductor patterns includes a double-layered structure comprising an undoped amorphous silicon pattern and a doped amorphous silicon pattern.

13. The device according to claim 12, wherein the switching and driving semiconductor layers include an active layer of undoped amorphous silicon and an ohmic contact layer of doped amorphous silicon.

14. The device according to claim 1, wherein the connecting pattern is formed of a multiple layer structure.

15. The device according to claim 2, wherein the connecting pattern has a pillar shape extending toward and connecting to the organic electroluminescent diode disposed on the second substrate.

16. The device according to claim 1, wherein the same layer is the first substrate.

* * * * *